United States Patent
Kim et al.

(10) Patent No.: US 12,178,015 B2
(45) Date of Patent: Dec. 24, 2024

(54) HEAT DISSIPATION DEVICE FOR ELECTRONIC ELEMENT

(71) Applicant: KMW INC., Hwaseong-si (KR)

(72) Inventors: Duk Yong Kim, Yongin-si (KR); Jin Soo Yeo, Hwaseong-si (KR); Kyu Chul Choi, Hwaseong-si (KR); In Hwa Choi, Yongin-si (KR); Youn Jun Cho, Hwaseong-si (KR); Jeong Hyun Choi, Hwaseong-si (KR); Jae Hyun Park, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 218 days.

(21) Appl. No.: 17/947,127

(22) Filed: Sep. 18, 2022

(65) Prior Publication Data

US 2023/0021186 A1 Jan. 19, 2023

Related U.S. Application Data

(63) Continuation of application No. PCT/KR2021/003395, filed on Mar. 19, 2021.

(30) Foreign Application Priority Data

Mar. 23, 2020 (KR) .......................... 10-2020-0034778
Mar. 18, 2021 (KR) .......................... 10-2021-0035433

(51) Int. Cl.
*H05K 7/20* (2006.01)
*H01Q 1/02* (2006.01)
(Continued)

(52) U.S. Cl.
CPC ........... *H05K 7/20345* (2013.01); *H01Q 1/02* (2013.01); *H01Q 1/42* (2013.01); *H05K 1/0203* (2013.01);
(Continued)

(58) Field of Classification Search
CPC ............. H05K 7/20345; H05K 1/0203; H05K 7/20172; H05K 7/20309; H05K 7/20318;
(Continued)

(56) References Cited

U.S. PATENT DOCUMENTS 5,943,211 A * 8/1999 Havey .................. H01L 25/105
174/15.1
6,009,721 A * 1/2000 Fukuda .................. F25B 15/02
62/495

(Continued)

FOREIGN PATENT DOCUMENTS

EP 3565057 A1 11/2019
JP 2012-222277 A 11/2012
(Continued)

OTHER PUBLICATIONS

International Search Report mailed Jul. 5, 2021 for International Application No. PCT/KR2021/003395 and its English translation.
(Continued)

*Primary Examiner* — Adam B Dravininkas
(74) *Attorney, Agent, or Firm* — Insight Law Group, PLLC; Seung Lee

(57) ABSTRACT

A heat dissipation device for an electronic element includes a first chamber containing a printed circuit board with heating elements, and a second chamber for heat exchange. The second chamber contains a refrigerant injection part and supply part. A heat transfer part between the chambers receives heat from the heating elements and transfers it to the second chamber. A condensing part condenses injected refrigerant. The heat transfer part has evaporation-inducing ribs on its surface exposed to the second chamber, allowing injected liquid refrigerant to be adsorbed and flow downward in a zigzag pattern. This configuration enables efficient heat dissipation through phase changes of the refrigerant as it evaporates and condenses. The device may also include
(Continued)

features like specially-shaped condensation ribs, a blower part to improve condensation, and a pressure regulator for the second chamber. This design provides improved heat dissipation performance without increasing device size.

24 Claims, 18 Drawing Sheets

(51) Int. Cl.
  *H01Q 1/42* (2006.01)
  *H05K 1/02* (2006.01)
(52) U.S. Cl.
  CPC ..... *H05K 7/20172* (2013.01); *H05K 7/20309* (2013.01); *H05K 7/20318* (2013.01); *H05K 7/20327* (2013.01); *H05K 7/2039* (2013.01); *H05K 2201/10098* (2013.01)
(58) Field of Classification Search
  CPC ............ H05K 7/20327; H05K 7/2039; H05K 2201/10098; F28D 1/0477; F28D 2021/0071; F28D 1/05391; H01Q 1/02; H01Q 1/42; H01Q 1/246; H01Q 1/1228
  See application file for complete search history.

(56) References Cited

U.S. PATENT DOCUMENTS

| | | | | |
|---|---|---|---|---|
| 6,341,645 B1* | 1/2002 | Tanaka | ................. | F25B 23/006 |
| | | | | 165/104.21 |
| 7,180,741 B1* | 2/2007 | Knight | ............... | H05K 7/20345 |
| | | | | 174/15.1 |
| 7,495,914 B2* | 2/2009 | Tilton | ................. | H01L 23/4735 |
| | | | | 361/689 |
| 8,305,759 B2* | 11/2012 | Attlesey | ............. | H05K 7/20772 |
| | | | | 165/80.4 |
| 10,698,304 B2* | 6/2020 | Iyoda | ................. | G03B 21/2033 |
| 2003/0205054 A1* | 11/2003 | Nori | ...................... | H01L 23/427 |
| | | | | 62/304 |
| 2006/0156750 A1* | 7/2006 | Lowenstein | .............. | F28D 3/02 |
| | | | | 62/271 |
| 2012/0268877 A1* | 10/2012 | Rice | .................... | H05K 7/20245 |
| | | | | 165/104.21 |
| 2015/0033772 A1* | 2/2015 | Agostini | ............ | H05K 7/20363 |
| | | | | 62/238.3 |
| 2021/0029819 A1* | 1/2021 | Yoo | .......................... | H01Q 1/02 |
| 2021/0125898 A1* | 4/2021 | Torresin | .................... | F28F 1/26 |

FOREIGN PATENT DOCUMENTS

| | | |
|---|---|---|
| KR | 10-2015-0051894 A | 5/2015 |
| KR | 10-2017-0097057 A | 8/2017 |
| KR | 10-2019-0068485 A | 6/2019 |
| KR | 10-2019-0118979 A | 10/2019 |
| TW | 201319509 A | 5/2013 |
| WO | 97-43887 A1 | 11/1997 |
| WO | 01/01741 A1 | 1/2001 |
| WO | 02/46677 A | 6/2002 |

OTHER PUBLICATIONS

Non-final Office Action mailed Oct. 31, 2023 from the Japanese Patent Office for Japanese Application No. 2022-557111.
European Search Report dated Aug. 6, 2024 for European Application No. 21775691.5.

* cited by examiner

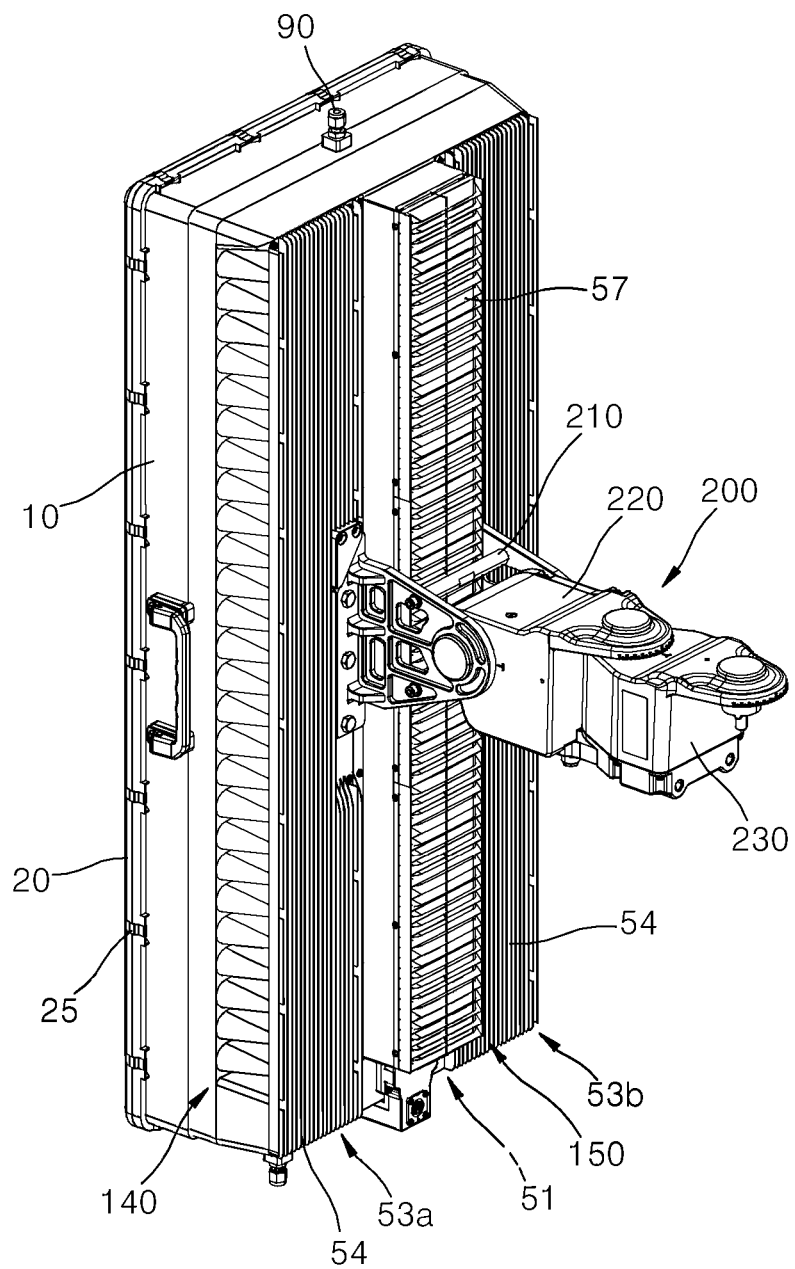

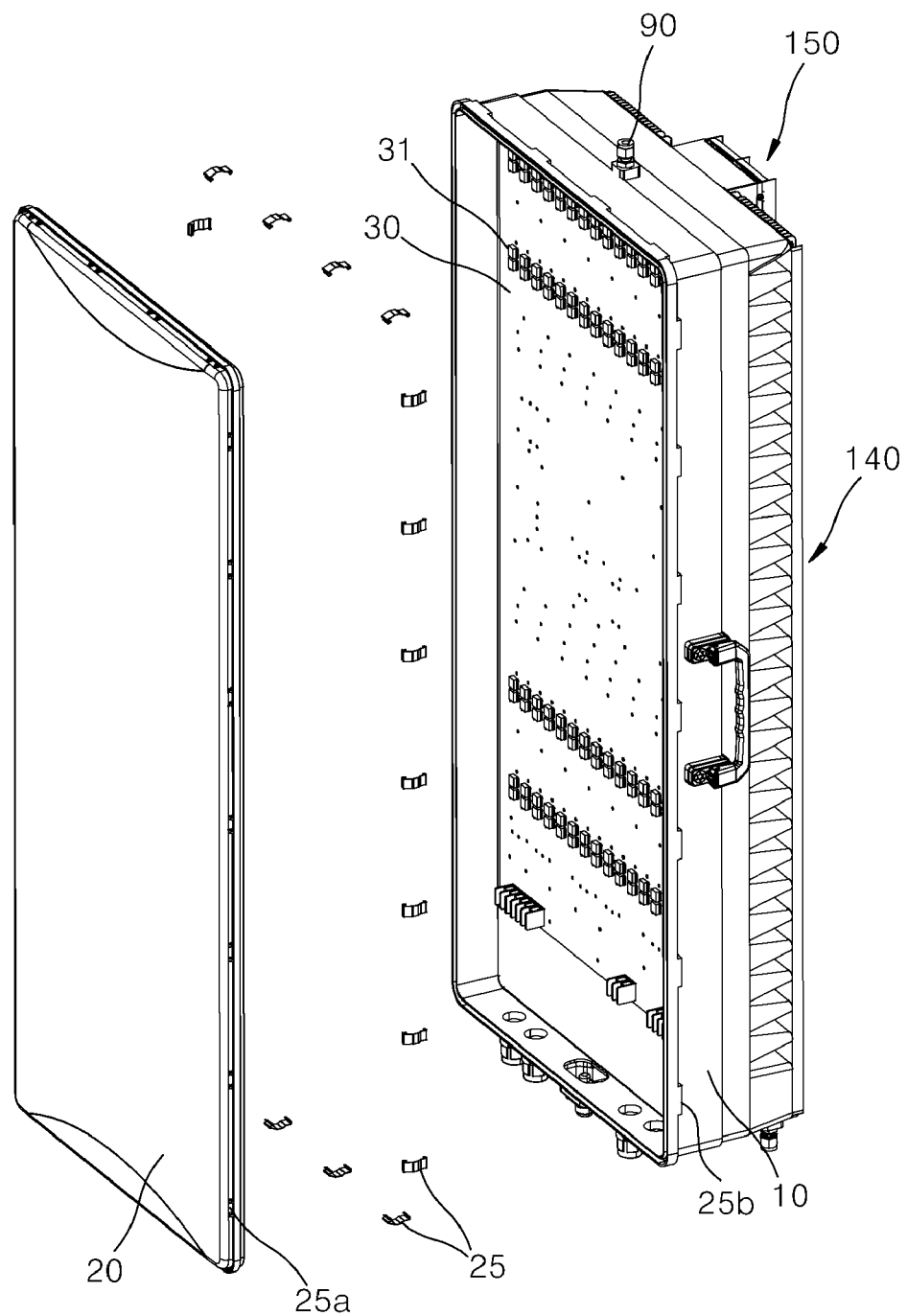

HEAT DISSIPATION DEVICE FOR ELECTRONIC ELEMENT

CROSS-REFERENCE TO RELATED APPLICATIONS

This application is a continuation application of International Application No. PCT/KR2021/003395, filed Mar. 19, 2021, which claims the benefit of Korean Patent Application Nos. 10-2020-0034778, filed Mar. 23, 2020; and 10-2021-0035433, filed Mar. 18, 2021, in the Korean Intellectual Property Office, the disclosures of which are incorporated herein in their entirety by reference.

TECHNICAL FIELD

The present invention relates to a heat dissipation device for an electronic element, and more particularly, to a heat dissipation device for an electronic element that serves to effectively dissipate heat generated by a heat source such as an antenna element mounted on a printed circuit board.

BACKGROUND ART

In general, as an example of wireless communication technologies, a multiple-input/multiple-output (MIMO) technology refers to a technology for innovatively increasing data transmission capacity by using a plurality of antennas. This technology uses a spatial multiplexing technique, in which a transmitter transmits different data through the respective transmission antennas, and a receiver distinguishes the transmitted data by performing appropriate signal processing.

Therefore, it is possible to transmit a larger amount of data by increasing both the number of transmitting antennas and the number of receiving antennas and thus increasing channel capacities. For example, if the number of antennas increases to ten, the channel capacity of about 10 times is ensured by using the same frequency band in comparison with the current single antenna system.

Eight antennas are used in 4G LTE-advanced, and a product equipped with 64 or 128 antennas has been developed in a current pre-5G step. It is expected that base station equipment having a much larger number of antennas will be used in 5G, which refers to a massive MIMO technology. The current cell management is 2-dimension, whereas 3D-beam forming is enabled when the massive MIMO technology is introduced, which also represents a full-dimension (FD) MIMO.

In the massive MIMO technology, the number of transmitters and the number of filters are also increased as the number of antennas (ANTs) is increased. Nevertheless, because of cost of lease or spatial restriction in respect to an installation location, RF components (antennas, filters, power amplifiers, transceivers, etc.) need to be practically manufactured to be small in size, light in weight, and inexpensive, and the massive MIMO requires a high output to expand a coverage. However, electric power consumption and heat generation, which are caused by the high output, have a negative effect on reductions in weight and size.

In particular, to install the MIMO antenna, in which modules including RF elements and digital elements are coupled in a layered structure, in a limited space, there is a need for a compact and small-scale design of a plurality of layers constituting the MIMO antenna in order to maximize ease of installation or spatial utilization. In this case, there is a need for a new design of a heat dissipation structure for dissipating heat generated by communication components mounted on the plurality of layers.

Korean Patent Application Laid-Open No. 10-2019-0118979 (published on Oct. 21, 2019, hereinafter, referred to as 'the related art') discloses a 'multiple-input/multiple-output antenna apparatus' that adopts a heat dissipation structure for a compact and small-scale design of a plurality of layers constituting a MIMO antenna.

The related art includes a heat dissipation main body having protruding heat dissipation fins, and a plurality of unit heat dissipation bodies installed on the heat dissipation main body. The plurality of unit heat dissipation bodies each has one end being in contact with a heating element of an antenna substrate, and a plurality of sub-heat dissipation fins are provided at the other end of each of the plurality of unit heat dissipation bodies and dissipate heat transferred from the heating element to the outside.

However, in the related art, the structure for dissipating heat from the heating element is configured only as a mechanical structure that is an air-cooled heat dissipation structure configured to exchange heat with outside air. For this reason, it is difficult to quickly dissipate the heat, and a large number of mechanical heat dissipation structures are required to quickly dissipate the heat, which causes a problem of an increase in size.

DISCLOSURE

Technical Problem

The present invention has been made in an effort to solve the above-mentioned problems, and an object of the present invention is to provide a heat dissipation device for an electronic element that improves heat dissipation performance while preventing an increase in size thereof.

Another object of the present invention is to provide a heat dissipation device for an electronic element that is capable of quickly dissipating heat generated by a heating element by injecting a refrigerant to one side of a space in which the heating element is disposed, and quickly evaporating the injected refrigerant.

Still another object of the present invention is to provide a heat dissipation device for an electronic element, in which a refrigerant supply part actively pumps and injects a refrigerant stored in a second chamber that substantially serves to dissipate heat, and a blower part disposed outside the second chamber is used to improve a rate of condensing the refrigerant by using outside air.

Technical problems of the present invention are not limited to the aforementioned technical problems, and other technical problems, which are not mentioned above, may be clearly understood by those skilled in the art from the following descriptions.

Technical Solution

An embodiment of the present invention provides a heat dissipation device for an electronic element, the heat dissipation device including: a first chamber in which a printed circuit board having heating elements mounted thereon is disposed; a second chamber configured to exchange heat with heat transferred from the first chamber and configured such that an injection part configured to inject a refrigerant and a refrigerant supply part configured to supply the refrigerant to the injection part are disposed in the second chamber; a heat transfer part disposed between the first chamber and the second chamber and configured to receive heat from the heating elements of the first chamber and supply the heat to the second chamber; and a condensing part configured to condense the refrigerant injected into the second chamber, in which a plurality of evaporation-inducing ribs is provided on a surface of the heat transfer part exposed to the second chamber and allows the liquid refrigerant injected by the injection part to be adsorbed and then flow downward in a zigzag direction.

In this case, the plurality of evaporation-inducing ribs may each include: a refrigerant inflow portion disposed adjacent to the injection part and provided vertically in an upward/downward direction; one side inclined portion inclined, bent, and extending downward toward one side from a lower end of the refrigerant inflow portion; and the other side inclined portion inclined, bent, and extending downward toward the other side from a lower end of one side inclined portion, and one side inclined portion and the other side inclined portion may be repeatedly formed.

In addition, the plurality of evaporation-inducing ribs may protrude in a direction from the first chamber to a portion where the second chamber is provided, the plurality of evaporation-inducing ribs being configured to adsorb the refrigerant injected from the injection part, and the plurality of evaporation-inducing ribs may define zigzag flow paths to increase a heat exchange area in which heat exchange with heat of the heating elements transferred from the first chamber is performed and to increase the adsorption time.

In addition, the heat transfer part may include: a partition plate part disposed to separate the first chamber and the second chamber; and a plurality of contact protrusions configured to be in contact with the printed circuit board and protruding from one surface of two opposite surfaces of the partition plate part that is exposed to the first chamber, and the plurality of evaporation-inducing ribs may integrally protrude from one surface of the two opposite surfaces of the partition plate part that is exposed to the second chamber.

In addition, the second chamber may be a space recessed forward from an end of a rim portion of the partition plate part and include a heat dissipation plate part configured to constitute the condensing part and coupled to cover a rear side of the partition plate part.

In addition, shapes of the plurality of contact protrusions may be designed in consideration of the amount of heat generation based on mounting positions of the heating elements mounted on the printed circuit board.

In addition, the condensing part may include: a heat dissipation plate part configured to define a part of a space of the second chamber while defining an external shape of a rear side of the second chamber; and a plurality of condensation ribs protruding toward a rear side of the heat dissipation plate part and recessed in the space of the second chamber so that a part of the space of the second chamber is expanded, the plurality of condensation ribs being formed in multiple stages in an upward/downward direction of the heat dissipation plate part, and the plurality of condensation ribs may each have a vertical cross-sectional area that gradually decreases toward the rear side of the heat dissipation plate part.

In addition, the second chamber may be a space recessed rearward from an end of a rim portion of the heat dissipation plate part and include a partition plate part configured to constitute the heat transfer part and coupled to cover a front side of the heat dissipation plate part.

In addition, the plurality of condensation ribs may each have an inner upper surface inclined downward and rearward, and an inner lower surface inclined upward and rearward.

In addition, an upward inclination angle of the inner lower surface with respect to any horizontal surface may be equal to or larger than a downward inclination angle of the inner upper surface with respect to the horizontal surface.

In addition, inner surfaces of the plurality of condensation ribs may have a plurality of fine stepped portions.

In addition, the condensing part may further include a plurality of support bars configured to support front ends of the plurality of condensation ribs and a rear surface of a partition plate part disposed to separate the first chamber and the second chamber.

In addition, the heat dissipation device may further include a radome configured to define an external shape of a front side of the first chamber, in which the first chamber is provided between the radome and a partition plate part that constitutes the heat transfer part, and in which the second chamber is provided between the partition plate part and a heat dissipation plate part of the condensing part that defines an external shape of a rear side of the second chamber.

In addition, the heat dissipation device may further include a mounting bracket configured to surround a rear side of the heat dissipation plate part and mediate coupling to a predetermined part and having left and right ends fixed to the partition plate part of the heat transfer part.

In addition, the heat dissipation device may further include a shield sealer interposed between the partition plate part and a rim portion of the heat dissipation plate part and configured to shield and seal the second chamber and an external space.

In addition, the heat transfer part may be configured such that the amount of generated heat transferred from the first chamber to the second chamber exchanges heat with total heat of the refrigerant, and the refrigerant stored in the second chamber may change in phase while being evaporated and condensed by a change in enthalpy of sensible heat and latent heat, such that heat is transferred from the first chamber to the second chamber.

In addition, the heat dissipation device may further include a blower part provided at a rear side of the condensing part and configured to blow outside air toward the condensing part.

In addition, the blower part may include: a plurality of air blowers arranged in multiple stages in an upward/downward direction at the rear side of the condensing part; and a pair of guide bracket panels configured to mediate coupling of the plurality of air blowers to the plurality of condensation ribs and laterally guide the air blown by the plurality of air blowers.

In addition, the blower part may further include a printed circuit board configured to control blowing and provided on any one of the pair of guide bracket panels and to control operations of the plurality of air blowers.

In addition, the heat dissipation device may further include a pair of blower parts respectively provided at two opposite left and right ends of the condensing part and configured to blow outside air in horizontal leftward and rightward directions.

In addition, the refrigerant supply part may be configured as a refrigerant supply pump positioned at a lower side of the second chamber, the injection part may be configured as a refrigerant injection nozzle positioned at an upper side of the second chamber and inject the refrigerant pumped by the refrigerant supply part, and the refrigerant supply pump and the refrigerant injection nozzle may be connected by a refrigerant flow pipe.

In addition, the refrigerant flow pipe may be fixed vertically in an upward/downward direction at a left or right end of a partition plate part, the refrigerant injection nozzle may be connected to and communicate with an upper end of the refrigerant flow pipe and fixed to an upper end of the partition plate part horizontally in a leftward/rightward direction, the refrigerant injection nozzle may have a plurality of injection nozzle holes through which the refrigerant is discharged downward, and the plurality of injection nozzle holes may be spaced apart from one another in the leftward/rightward direction.

In addition, the heat dissipation device may further include a pair of connecting pins configured to penetrate the heat transfer part between the first chamber and the second chamber and electrically connect the printed circuit board in the first chamber and the refrigerant supply pump in the second chamber.

In addition, the heat dissipation device may further include a pressure regulator configured to adjust a pressure in the second chamber.

In addition, the heating element may include at least one of an antenna element and a radio unit (RU).

Advantageous Effects

According to the embodiment of the heat dissipation device for an electronic element according to the present invention, the injection part injects the refrigerant, which is supplied from the refrigerant supply part, into the second chamber, and the heat transfer part is configured such that the amount of generated heat, which is transferred from the first chamber to the second chamber, exchanges heat with total heat of the refrigerant. Therefore, the refrigerant stored in the second chamber transfers heat from the first chamber to the second chamber while changing in phase by being evaporated and condensed by a change in enthalpy of sensible heat and latent heat. Therefore, it is possible to quickly dissipate the heat generated from the heating element, which is mounted on the printed circuit board disposed in the first chamber, by means of a change in phase of the refrigerant.

In addition, according to the embodiment of the heat dissipation device for an electronic element according to the present invention, the blower part is used to effectively cool the condensing part for changing the phase of the refrigerant, which makes it possible to more significantly improve heat dissipation performance.

The effects of the present invention are not limited to the aforementioned effects, and other effects, which are not mentioned above, will be clearly understood by those skilled in the art from the claims.

DESCRIPTION OF DRAWINGS

FIGS. 2A and 2B are perspective views illustrating a heat dissipation device for an electronic element according to another embodiment of the present invention.

FIG. 3 is an exploded perspective view illustrating a state in which a radome panel, among the components illustrated in FIGS. 2A and 2B, is installed.

EXPLANATION OF REFERENCE NUMERALS AND SYMBOLS

Figure 1A:
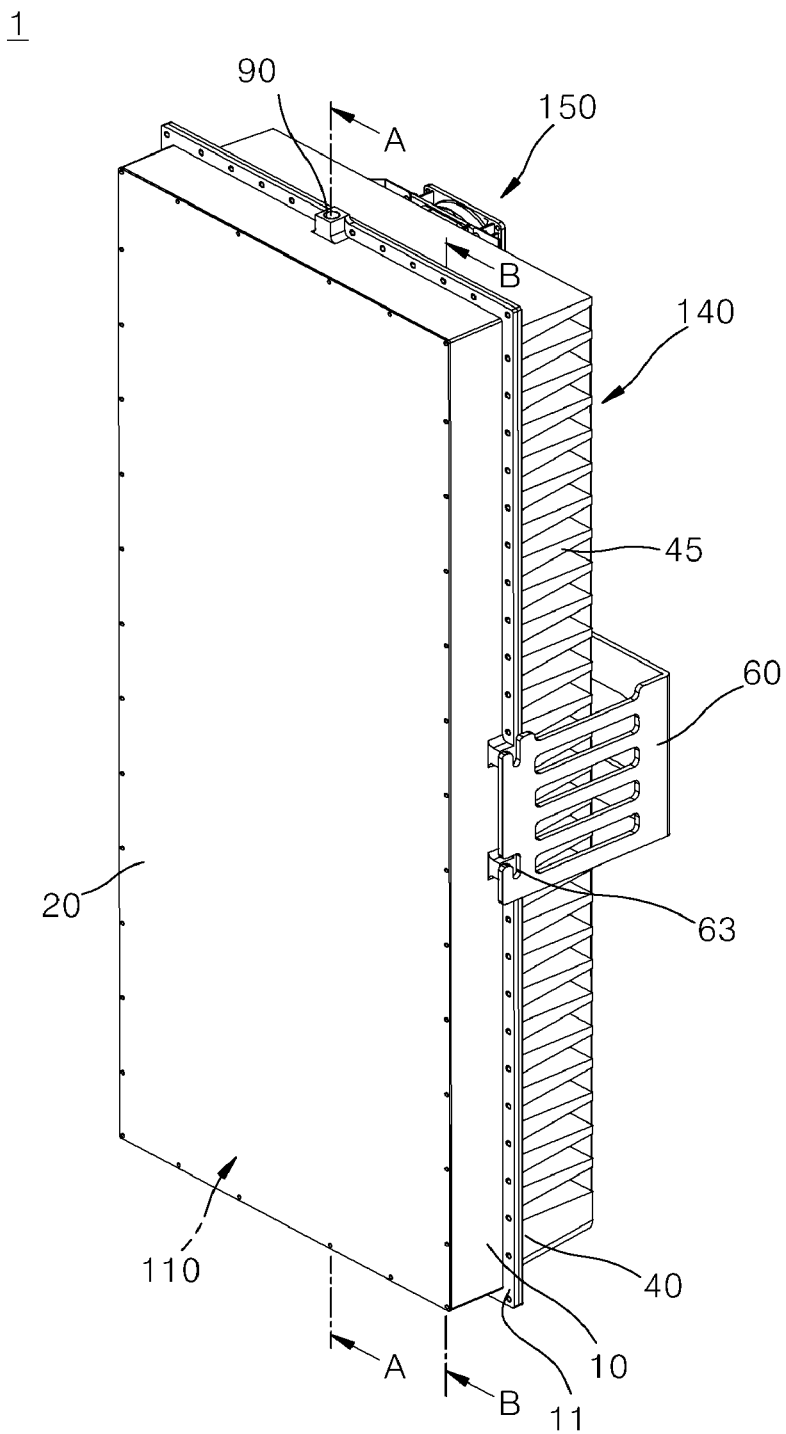
FIGS. 1A and 1B are perspective views illustrating a heat dissipation device for an electronic element according to an embodiment of the present invention.

1: Heat dissipation device for electronic element
10: Partition plate part
11: Rim portion of partition plate part
12: Screw coupling part
13: Contact protrusion
15: Evaporation-inducing rib
16: Refrigerant inflow portion
17: One side inclined portion
18: The other side inclined portion
19: Refrigerant outflow portion
20: Radome panel
30: Printed circuit board
31: Heating element
33: Heat transfer groove
40: Heat dissipation plate part
43: Refrigerant storage rib
45: Condensation rib
46: Fine stepped portion
51: Air blower
53a, 53b: Guide bracket panel
55: Printed circuit board for air blower
60: Mounting bracket
61a: Left end
61b: Right end
63: Seating groove
70: Shield sealer
81: Refrigerant supply part
83: Injection part
85: Refrigerant flow pipe
87: Connecting pin
90: Pressure regulator
110: Heat transfer part
140: Condensing part
150: Blower part
C1: First chamber
C2: Second chamber

BEST MODE

Hereinafter, a heat dissipation device for an electronic element according to an embodiment of the present invention will be described in detail with reference to the accompanying drawings.

In giving reference numerals to constituent elements of the respective drawings, it should be noted that the same constituent elements will be designated by the same reference numerals, if possible, even though the constituent elements are illustrated in different drawings. Further, in the following description of the embodiments of the present invention, a detailed description of related publicly-known configurations or functions will be omitted when it is determined that the detailed description obscures the understanding of the embodiments of the present invention.

In addition, the terms first, second, A, B, (a), and (b) may be used to describe constituent elements of the embodiments of the present invention. These terms are used only for the purpose of discriminating one constituent element from another constituent element, and the nature, the sequences, or the orders of the constituent elements are not limited by the terms. Further, unless otherwise defined, all terms used herein, including technical or scientific terms, have the same meaning as commonly understood by those skilled in the art to which the present invention pertains. The terms such as those defined in commonly used dictionaries should be interpreted as having meanings consistent with meanings in the context of related technologies and should not be interpreted as ideal or excessively formal meanings unless explicitly defined in the present application.

Figure 1B:
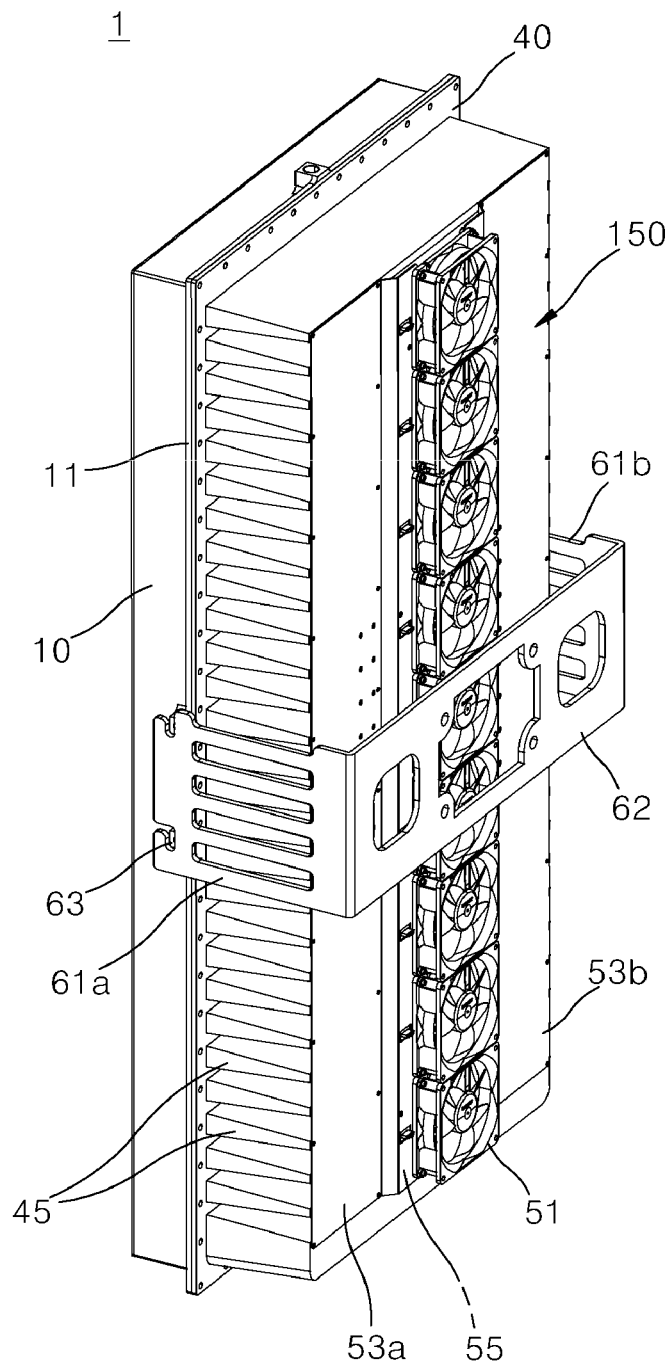
Figure 2A:
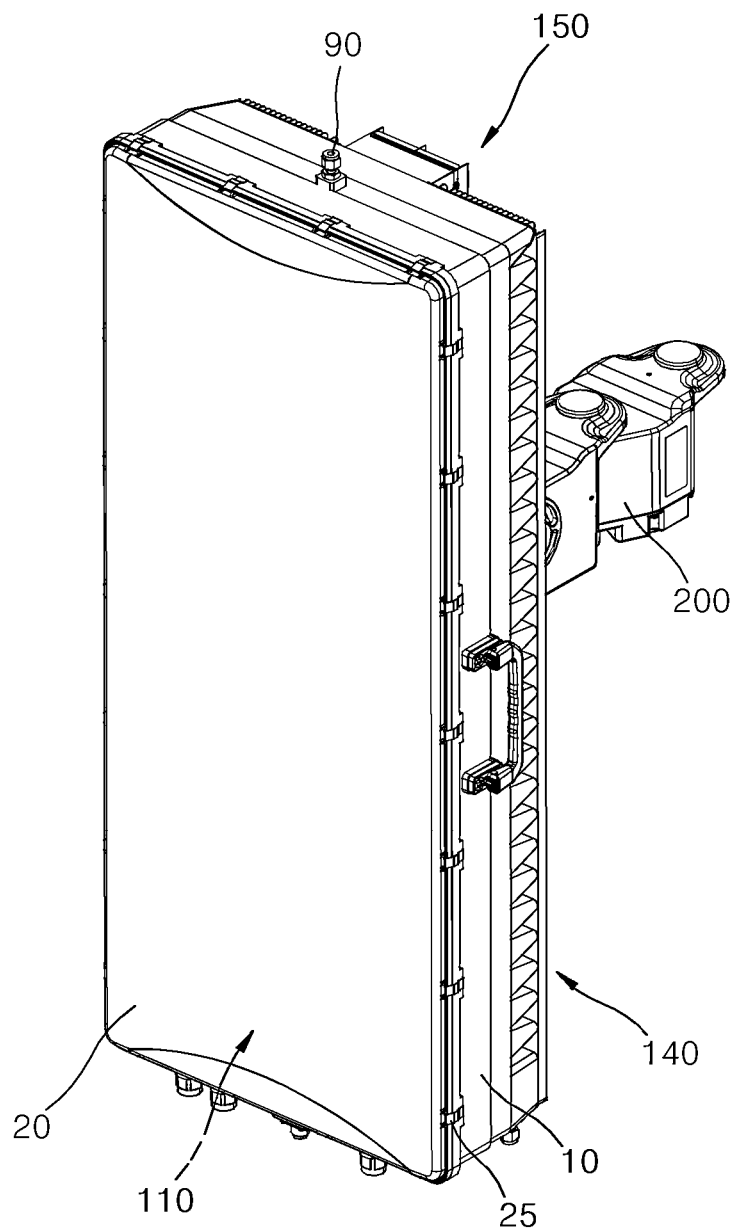
Figure 4A:
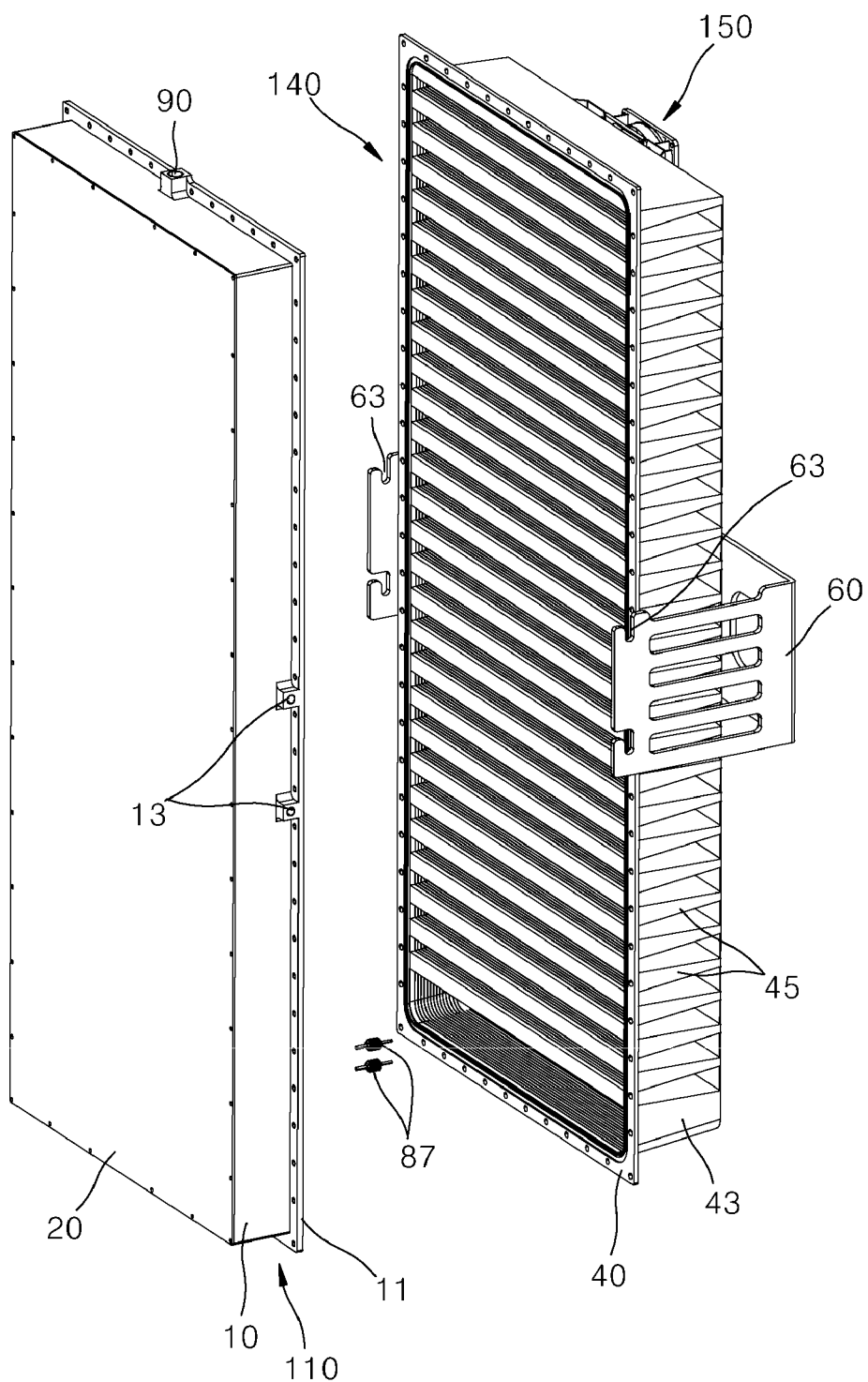
FIGS. 4A and 4B are exploded perspective views of FIGS. 1A and 1B.
Figure 4B:
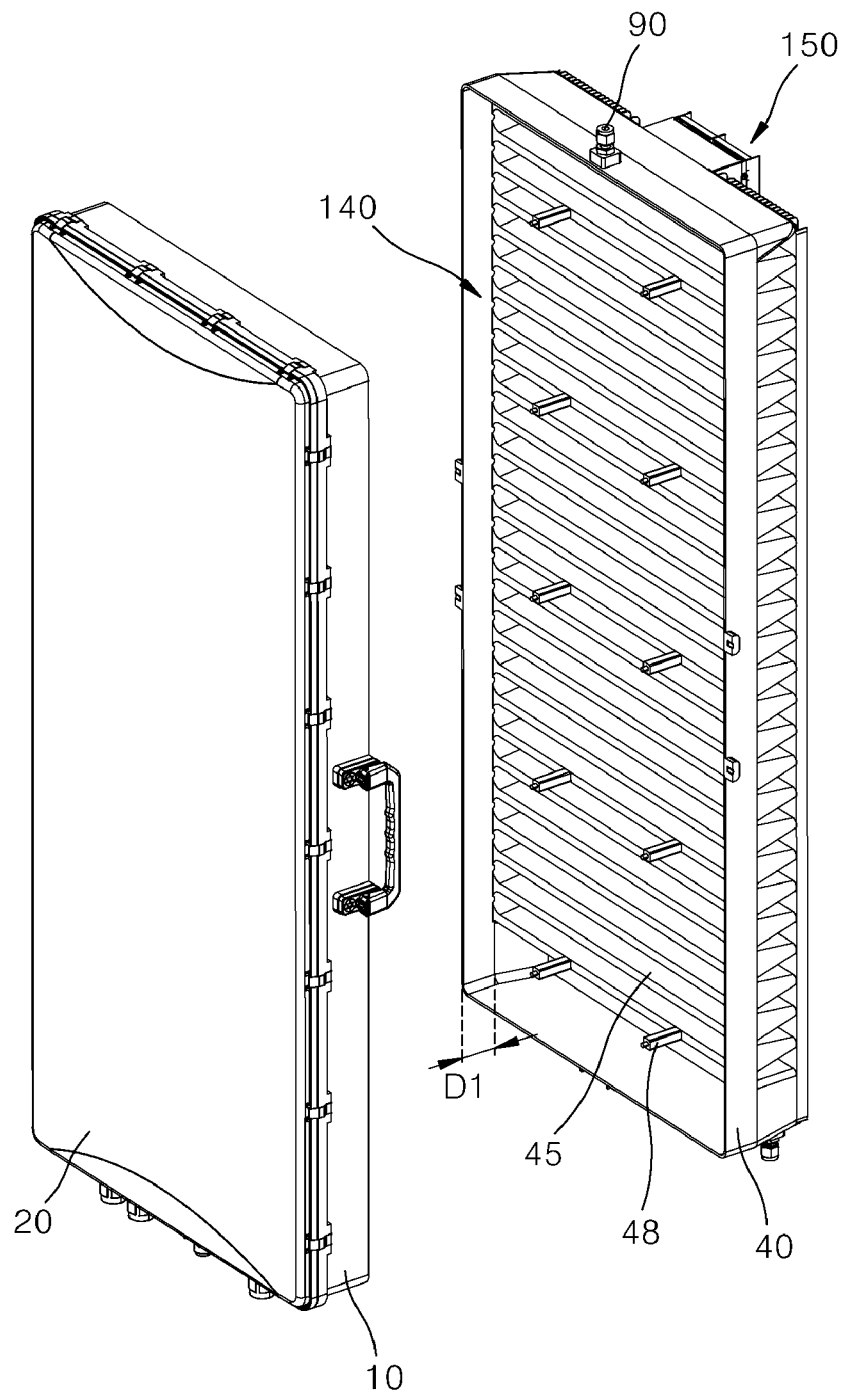
Figure 5:
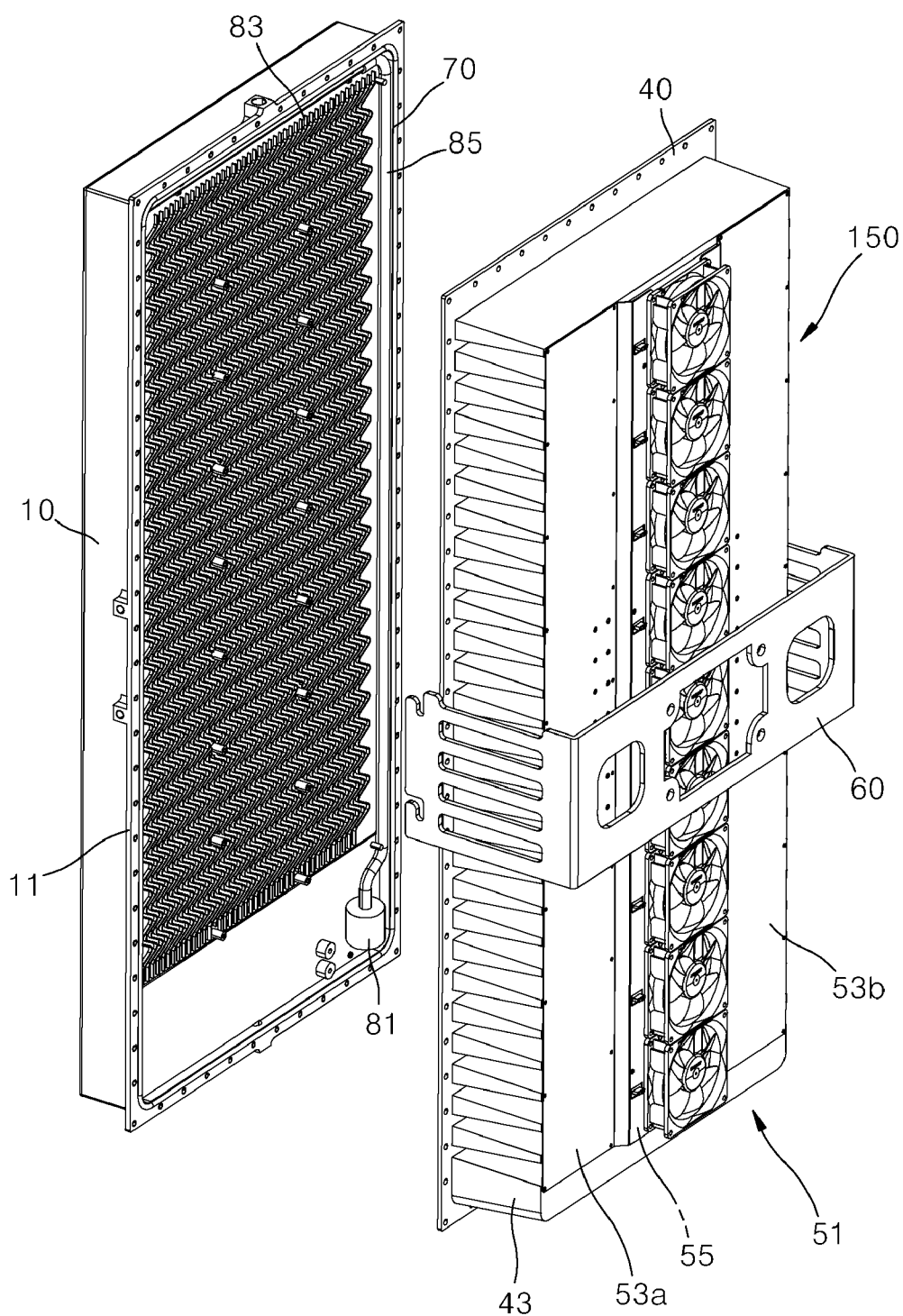
FIG. 5 is an exploded perspective view of FIG. 2A.

FIGS. 1A and 1B are perspective views illustrating a heat dissipation device for an electronic element according to an embodiment of the present invention, FIGS. 2A and 2B are perspective views illustrating a heat dissipation device for an electronic element according to another embodiment of the present invention, FIG. 3 is an exploded perspective view illustrating a state in which a radome panel, among the components illustrated in FIGS. 2A and 2B, is installed, FIGS. 4A and 4B are exploded perspective views of FIGS. 1A and 1B, and FIG. 5 is an exploded perspective view of FIG. 2A.

As illustrated in FIGS. 1A to 4B, a heat dissipation device 1 for an electronic element according to the present invention includes: a first chamber C1 in which a printed circuit board 30 is disposed; a second chamber C2 disposed to be separated from the first chamber C1 and configured to dissipate heat transferred from the first chamber C1; a heat transfer part 110 configured to transfer heat from the first chamber C1 to the second chamber C2; and a condensing part 140 configured to condense a refrigerant injected into the second chamber C2.

The printed circuit board 30 may be disposed in the first chamber C1. A plurality of heating elements 31 may be mounted on the printed circuit board 30. The plurality of heating elements 31 may be mounted on a front surface of two opposite surfaces of the printed circuit board 30. However, the present invention is not limited to the configuration in which the plurality of heating elements 31 is necessarily mounted only on the front surface of the printed circuit board 30. The plurality of heating elements 31 may of course be mounted on both the two opposite surfaces of the printed circuit board 30. Alternatively, the plurality of heating elements 31 may be mounted on a rear surface of the printed circuit board 30. In particular, in the case of the heating element 31 that generates a relatively large amount of heat, the heating element 31 may be mounted on the rear surface of the printed circuit board 30 and be in direct surface contact with a front surface of the heat transfer part 110 which will be described, such that the heating element 31 may directly dissipate heat through thermal conduction.

Meanwhile, the first chamber C1 may be in a non-vacuum state. Further, the second chamber C2 may be a space of which the pressure may be adjusted by a pressure regulator 90 to be described below.

That is, the pressure regulator 90 may be further provided in an upper or lower side of the second chamber C2 and adjust a pressure in the second chamber C2. The pressure regulator 90 may be configured to operate automatically depending on the pressure in the second chamber C2. Of course, the pressure regulator 90 may be configured to be opened or closed manually, such that a user may arbitrarily adjust heat dissipation performance by manually adjusting the pressure in the second chamber C2.

As illustrated in FIG. 3, a rim portion 11 of a partition plate part 10 may protrude forward to define the space of the first chamber C1. A radome panel 20 may be attached to the rim portion 11 of the partition plate part 10. Therefore, the first chamber C1 may be defined as an internal space closed by the partition plate part 10 and the radome panel 20.

An injection part 83 and a refrigerant supply part 81 may be disposed in the second chamber C2. The injection part 83 may inject the refrigerant. In this case, the refrigerant supply part 81 may be configured as a refrigerant supply pump positioned at a lower side of the second chamber C2. Further, the injection part 83 may be configured as a refrigerant injection nozzle positioned at an upper side of the second chamber C2 and configured to inject the refrigerant pumped by the refrigerant supply part 81. The refrigerant supply pump, which is the refrigerant supply part 81, and the refrigerant injection nozzle, which is the injection part 83, may be connected by a refrigerant flow pipe 85. A specific coupling relationship between the refrigerant supply part 81, the refrigerant flow pipe 85, and the injection part 83 and a refrigerant supply structure will be described below in more detail.

The heat transfer part 110 may be disposed between the first chamber C1 and the second chamber C2. Therefore, a front surface of the partition plate part 10 serves to collect heat generated from the first chamber C1. A rear surface of the partition plate part 10 serves to dissipate heat, which is transferred from the first chamber C1 through the partition plate part 10, to the second chamber C2 through a plurality of evaporation-inducing ribs 15 integrated with the rear surface of the partition plate part 10.

The heat transfer part 110 serves to transfer the heat, which is generated from the first chamber C1, directly to the second chamber C2 by thermal conduction and also serves to exchange heat with the refrigerant injected into the second chamber C2. That is, the refrigerant, which is supplied by the refrigerant supply part 81 through the injection part 83, is adsorbed to a rear surface of the heat transfer part 110 adjacent to the second chamber C2 and cools sensible heat, which is generated from the heating elements 31 of the printed circuit board 30 and transferred from the first chamber C1, by using vaporized latent heat, and the refrigerant may be evaporated.

The heat transfer part 110 may be configured such that the amount of generated heat transferred from the first chamber C1 to the second chamber C2 exchanges heat with total heat of the refrigerant. The refrigerant stored in the second chamber C2 may change in phase while being evaporated and condensed by a change in enthalpy of sensible heat and latent heat, such that the heat is transferred from the first chamber C1 to the second chamber C2.

As illustrated in FIGS. 1A to 4B, the condensing part 140 may include: a heat dissipation plate part 40 made of a thermally conductive material and configured to define a part of the space of the second chamber C2 while defining an external shape of a rear side of the second chamber C2; and a plurality of condensation ribs 45 protruding toward a rear side of the heat dissipation plate part 40 and recessed in the space of the second chamber C2 so that a part of the space of the second chamber C2 is expanded. The plurality of condensation ribs 45 may be formed in multiple stages in an upward/downward direction of the heat dissipation plate part 40.

The condensing part 140 serves to allow the liquid refrigerant injected through the injection part 83 to be vaporized and then condensed and liquefied again based on the principle of sensible heat and latent heat in the second chamber C2 through the rear surface of the heat transfer part 110. The specific condensation principle and structure of the condensing part 140 will be described below in more detail.

As illustrated in FIGS. 1A and 1B, the heat dissipation device 1 for an electronic element according to the embodiment of the present invention may be fixedly installed on a predetermined part such as a strut pole (not illustrated) by means of a mounting bracket 60 coupled to the rear surface of the heat dissipation plate part 40 to be described below.

However, the heat dissipation device need not be necessarily fixed to the strut pole (not illustrated) by means of the mounting bracket 60. As illustrated in FIGS. 2A and 2B, according to the heat dissipation device 1 for an electronic element according to another embodiment of the present invention, the heat dissipation device may be coupled to the strut pole by means of a clamping device 200 that mediates the coupling between the heat dissipation device and the strut pole (not illustrated). Further, the clamping device 200 may be tilted or rotated to easily set directionality of an antenna device including an electrical component such as an antenna element as the heating element 31.

As illustrated in FIG. 2B, the clamping device 200 may include: a tilting part 210 coupled to the rear surface of the heat dissipation plate part 40 and configured to tilt in the upward/downward direction about a horizontal tilting shaft (no reference numeral); a rotating part 220 configured to mediate the tilting coupling of the tilting part 210 and rotate in a leftward/rightward direction about a vertical rotating shaft (no reference numeral); and a coupling part 230 configured to mediate the rotating coupling of the rotating part 220 and mediated the coupling to the strut pole.

The clamping device 200 may have therein a tilting motor (not illustrated) and a rotating motor (not illustrated) that electrically operate, such that the tilting operation and the rotating operation may be remotely adjusted.

Meanwhile, as illustrated in FIG. 1A, the first chamber C1 may be defined as a space in which the partition plate part 10, which will be described below, and the radome panel 20 coupled to a front end of the partition plate part 10 are provided.

In this case, the radome panel 20 may be coupled to an end of a rim portion 11 of the partition plate part 10 by a screw fixing method using fixing screws (not illustrated).

However, the radome panel 20 need not be necessarily coupled by the screw-fixing method. As illustrated in FIGS. 2A, 2B, and FIG. 3, the radome panel 20 may be coupled to the front end of the partition plate part 10 by a clip-fixing method using a plurality of clip members 25. To this end, clip front end catching portions 25a may be formed on a rim portion of the radome panel 20, and clip rear end catching portions 25b may be formed on a rim portion of the partition plate part 10. Front and rear ends of each of the plurality of clip members 25 may be respectively elastically deformed and fixed to the clip front end catching portion 25a and the clip rear end catching portion 25b.

Meanwhile, as illustrated in FIGS. 4A and 4B, the second chamber C2 may be defined as a space defined between the rear space of the partition plate part 10 to be described below and the front end of the heat dissipation plate part 40.

More specifically, as illustrated in FIG. 4A, a predetermined space may be formed in the rear surface of the partition plate part 10 and recessed forward by a predetermined depth from the rear end of the partition plate part 10. The heat dissipation plate part 40 may be coupled to cover the rear end of the partition plate part 10, thereby defining the space of the second chamber C2. In this case, a front end of each of the plurality of condensation ribs 45 of the condensing part 140 provided on the heat dissipation plate part 40 may be provided at the same position as the front end of the heat dissipation plate part 40.

However, the second chamber C2 need not be necessarily defined as illustrated in FIG. 4A. As illustrated in FIG. 4B, a rear end of the heat transfer part 110 formed on the rear surface of the partition plate part 10 may be provided at the same position as the rear end of the partition plate part 10, and the front end of each of the plurality of condensation ribs 45 of the condensing part 140 may be positioned rearward by a predetermined depth from the front end of the heat dissipation plate part 40 (see reference numeral D1 in FIG. 4B). Further, the partition plate part 10 may be coupled to cover the front side of the heat dissipation plate part 40, such that the second chamber C2 may be defined as being formed substantially at the side of the heat dissipation plate part 40. In this case, the heat dissipation plate part 40 may mean a one-piece heat dissipation housing of the condensing part 140.

Meanwhile, as illustrated in FIGS. 1A to 4B, the heat dissipation device 1 for an electronic element according to the embodiment of the present invention may further include a blower part 150.

The blower part 150 may be provided at a rear side of the condensing part 140 and serves to blow outside air so that evaporated refrigerant in the second chamber C2 is more quickly condensed by the condensing part 140 made of a metallic material. The specific air blowing principle and structure of the blower part 150 will be described below in more detail.

Figure 6:
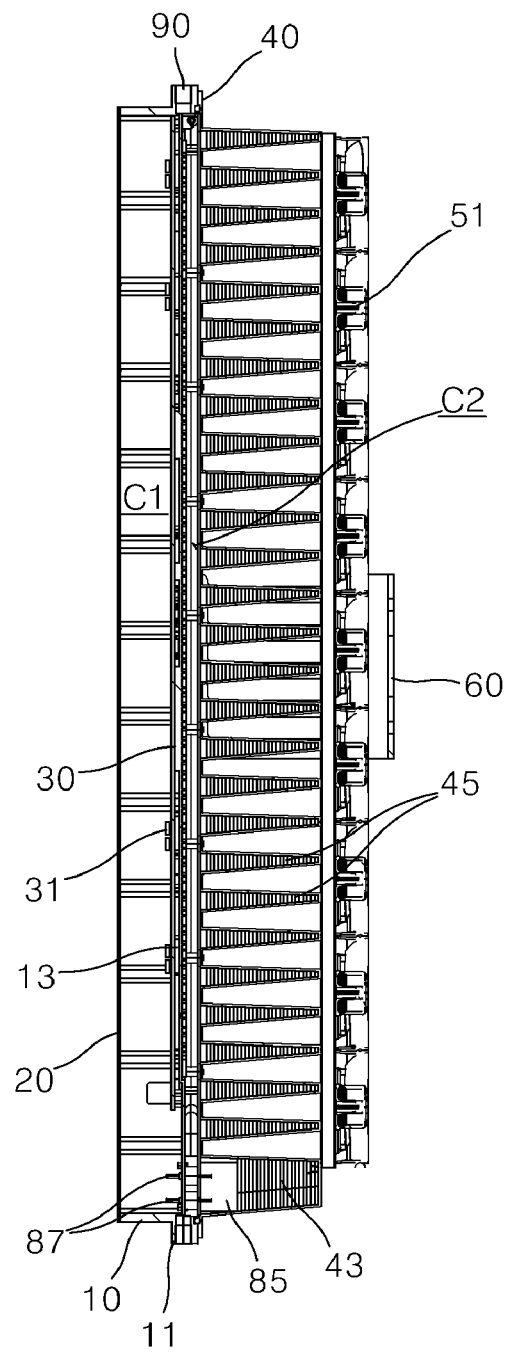
FIG. 6 is a cross-sectional view taken along line A-A in FIG. 1A.
Figure 7:
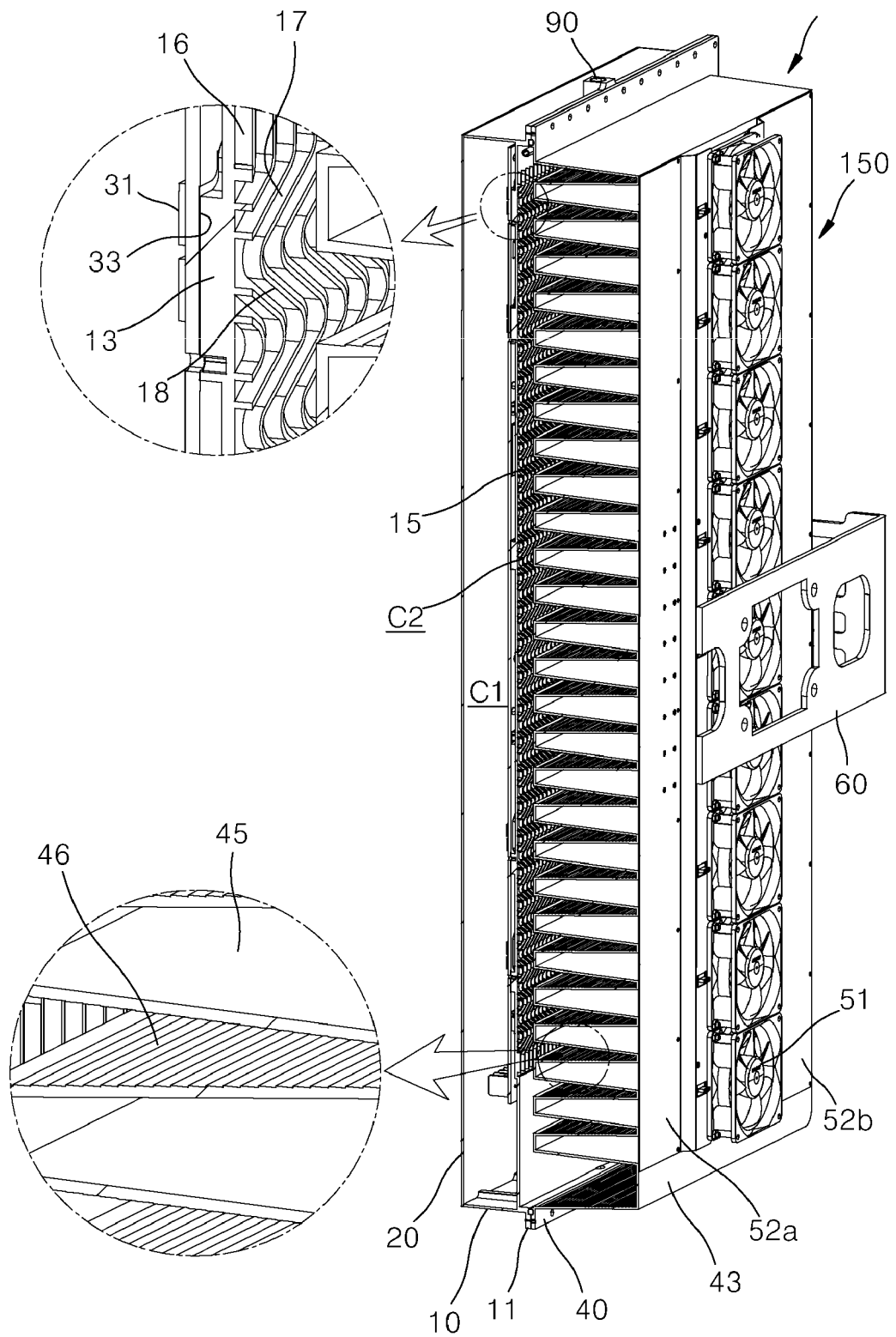
FIG. 7 is a cut-away perspective view taken along line B-B in FIG. 1A and a partially enlarged view thereof.
Figure 8:
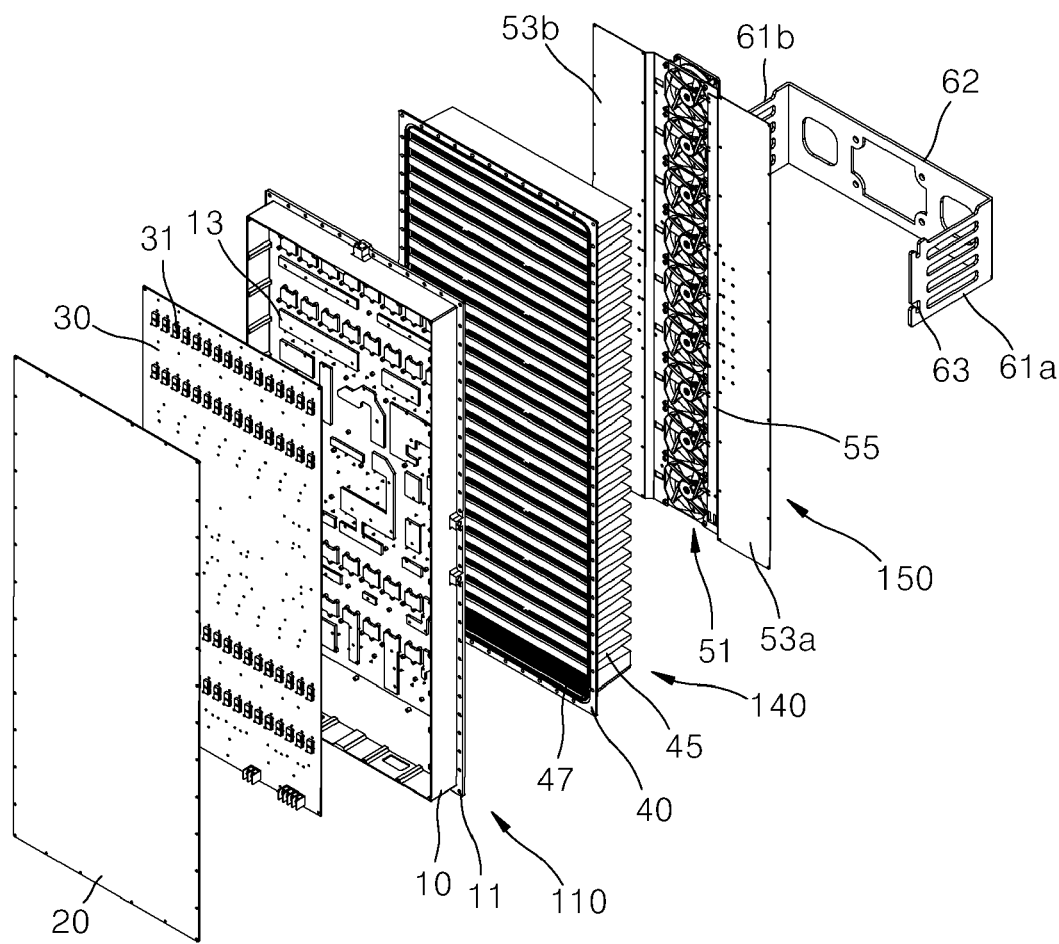
FIG. 8 is a cut-away perspective view illustrating a part of a rear surface of a heat transfer part and a partially enlarged view thereof.

FIG. 6 is a cross-sectional view taken along line A-A in FIG. 1A, FIG. 7 is a cut-away perspective view taken along line B-B in FIG. 1A and a partially enlarged view thereof, and FIG. 8 is a cut-away perspective view illustrating a part of a rear surface of a heat transfer part and a partially enlarged view thereof.

As illustrated in FIGS. 6 and 7, the heat dissipation device 1 for an electronic element according to the embodiment of the present invention may include the first chamber C1 and the second chamber C2. The printed circuit board 30 may be vertically disposed in the upward/downward direction in the first chamber C1. The plurality of heating elements 31 may be mounted on at least any one of the front and rear surfaces of the printed circuit board 30 and generate heat while electrically operating. The present embodiment adopts the configuration in which the heating elements 31 are mounted on the front surface of the two opposite surfaces of the printed circuit board 30, a plurality of heat transfer grooves 33 is processed and formed in the rear surface of the two opposite surfaces of the printed circuit board 30, and a plurality of contact protrusions 13 of the heat transfer part 110, which will be described below, is inserted into and in surface contact with the plurality of heat transfer grooves 33.

The heating elements 31 mounted on the front surface of the printed circuit board 30 may include at least one of an antenna element and a radio unit (RU). The antenna element may transmit and receive a wireless signal. The radio unit may process the wireless signal.

When the heating element 31 is configured as the antenna element as described above, the heat dissipation device 1 for an electronic element according to the embodiment of the present invention may be a multiple-input/multiple-output antenna apparatus installed by a communication carrier that installs a base station.

In addition, when the heating element 31 is configured as the radio unit, the heat dissipation device 1 for an electronic element according to the embodiment of the present invention may be a wireless signal processing apparatus of a network equipment company that manufactures the base station.

As illustrated in FIGS. 6 and 7, the first chamber C1 and the second chamber C2 may be separated in a forward/rearward direction by the heat transfer part 110.

More specifically, the heat transfer part 110 may include: the partition plate part 10 configured to separate the first chamber C1 and the second chamber C2; and the plurality of contact protrusions 13 configured to be in contact with the printed circuit board 30 and protruding from one surface of the two opposite surfaces of the partition plate part 10, one surface being exposed to the first chamber C1.

Further, the heat transfer part 110 may further include the plurality of evaporation-inducing ribs 15 integrally formed on the rear surface of the heat transfer part 110 that corresponds to the side of the second chamber C2. In this case, the partition plate part 10, the plurality of contact protrusions 13, and the plurality of evaporation-inducing ribs 15 may be integrated and made of a metallic material excellent in thermal conductivity.

The rim portion 11 of the partition plate part 10 may protrude forward and define the space of the first chamber C1. The radome panel 20 may be attached to the rim portion 11 of the partition plate part 10. Therefore, the first chamber C1 may be defined as an internal space closed by the partition plate part 10 and the radome panel 20. However, the first chamber C1 need not be necessarily defined as described above. Although not illustrated in the drawings, the rim portion of the radome panel 20 may extend rearward and define the substantial space of the first chamber C1.

The printed circuit board 30 may be disposed between the radome panel 20 and the partition plate part 10 that constitutes the first chamber C1. The printed circuit board 30 may be installed to be in close contact with the partition plate part 10 so that the plurality of contact protrusions 13, which is formed on the front surface of the partition plate part 10, is respectively inserted into and in surface contact with the heat transfer grooves 33 formed in the rear surface of the printed circuit board 30. However, in a case in which the heating elements 31 are mounted directly on the rear surface of the printed circuit board 30 without the heat transfer groove 33 separately provided, the plurality of contact protrusions 13 may of course be thermally in direct surface contact with the rear surfaces of the heating elements 31. In this case, the sizes and shapes of the heat transfer grooves 33 and the sizes and shapes of the plurality of contact protrusions 13 formed to be in contact with the heat transfer grooves 33 may be designed in consideration of the amount of heat generation based on mounting positions of the heating elements 31 mounted on the front surface of the printed circuit board 30.

Referring to the enlarged views of FIGS. 7 and 8, the plurality of evaporation-inducing ribs 15, which is formed on the rear surface of the two opposite surfaces of the partition plate part 10 that is a surface exposed to the second chamber C2, may each include: a refrigerant inflow portion 16 disposed vertically in the upward/downward direction and provided adjacent to the injection part 83 provided at the upper side of the second chamber C2; one side inclined portion 17 inclined, bent, and extending downward toward one side from a lower end of the refrigerant inflow portion 16; and the other side inclined portion 18 inclined, bent, and extending downward toward the other side from a lower end of one side inclined portion 17. Further, referring to the enlarged view of FIG. 5, the plurality of evaporation-inducing ribs 15 may each further include a refrigerant outflow portion 19 extending by a predetermined length vertically in the upward/downward direction toward the lower side of the second chamber C2 from a portion where repeated shapes of one side inclined portion 17 and the other side inclined portion 18 are ended.

As described above, the evaporation-inducing ribs 15 formed on the rear surface of the partition plate part 10 may each have one side inclined portion 17 and the other side inclined portion 18 that are repeatedly formed and elongated in the upward/downward direction. A plurality of wave-pattern refrigerant flow paths each having a zigzag shape may be formed between the adjacent evaporation-inducing ribs 15 formed equally, such that the liquid refrigerant may flow through the refrigerant flow paths while being adsorbed. The configuration in which one side inclined portion 17 and the other side inclined portion 18 are repeatedly formed is provided to increase an overall heat exchange surface area of the plurality of evaporation-inducing ribs 15, if possible. As described above, the plurality of evaporation-inducing ribs 15 serves to increase a heat exchange area of the heat transferred from the heating element 31 and increase the time for which the refrigerant is adsorbed.

That is, when the liquid refrigerant in the form of a spray injected by the injection part 83 from the upper side of the second chamber C2 is adsorbed to the plurality of evaporation-inducing ribs 15, the refrigerant is evaporated into a gaseous refrigerant by the heat transferred from the first chamber C1, and the plurality of evaporation-inducing ribs 15 serves to assist in quickly evaporating the remaining liquid refrigerant, which is not evaporated, by allowing the remaining liquid refrigerant to flow downward in a zigzag manner along the refrigerant flow paths.

In addition, the heat transfer part 110 may be defined as a component configured to perform mutual heat exchange by using the principle of the sensible heat transferred from the first chamber C1 to the second chamber C2 and the latent heat by which the liquid refrigerant is evaporated. More specifically, the heat transfer part 110 may be configured such that the amount of generated heat transferred from the first chamber C1 to the second chamber C2 exchanges heat with the total heat of the refrigerant. The refrigerant stored in the second chamber C2 may change in phase while being evaporated and condensed by a change in enthalpy of the latent heat and the sensible heat of the refrigerant, such that the heat is transferred from the first chamber C1 to the second chamber C2.

Meanwhile, as illustrated in FIGS. 6 and 7, the condensing part 140 may include: the heat dissipation plate part 40 configured to define a part of the space of the second chamber C2 while defining the external shape of the rear side of the second chamber C2; and the plurality of condensation ribs 45 protruding toward the rear side of the heat dissipation plate part 40 and recessed rearward in the space of the second chamber C2 so that a part of the space of the second chamber C2 is expanded. The plurality of condensation ribs 45 may be formed in multiple stages in the upward/downward direction of the heat dissipation plate part 40.

In this case, the condensing part 140 may serve to condense the gaseous refrigerant, which is evaporated by the plurality of evaporation-inducing ribs 15, into the liquid refrigerant by exchanging heat with the gaseous refrigerant.

The plurality of condensation ribs 45 may respectively define vacant spaces that are formed through the heat dissipation plate part 40 and communicate with the second chamber C2. The plurality of condensation ribs 45 may protrude by a predetermined length rearward from the heat dissipation plate part 40 and each have a rectangular vertical cross-section elongated in the approximately leftward/rightward direction.

More specifically, as illustrated in FIGS. 6 and 7, the plurality of condensation ribs 45 may each have a vertical cross-sectional area that gradually decreases toward the rear side of the heat dissipation plate part 40. In this case, the plurality of condensation ribs 45 may each have an inner upper surface inclined downward and rearward, and an inner lower surface inclined upward and rearward.

Therefore, when the liquid refrigerant is condensed on inner surfaces of the plurality of condensation ribs 45 in the second chamber C2, the liquid refrigerant may flow downward in a gravitational direction along the inclined inner upper surfaces or the inclined inner lower surfaces, such that the liquid refrigerant may be easily collected in the lower space of the second chamber C2.

Particularly, the plurality of condensation ribs 45 may each be formed such that an upward inclination angle of the inner lower surface with respect to any horizontal surface is equal to or larger than a downward inclination angle of the inner upper surface with respect to the horizontal surface. Therefore, the collection of the liquid refrigerant to the lower side of the second chamber C2 may be more easily performed.

Further, the inner surfaces of the plurality of condensation ribs 45 may have a plurality of fine stepped portions 46. This is to increase surface areas of the plurality of condensation ribs 45 and reduce the time for which the gaseous evaporated refrigerant is condensed. That is, the amount of refrigerant to be recovered is increased by increasing hydrophobicity of the surface by treating the surfaces of the plurality of condensation ribs 45. Therefore, the vaporized refrigerant evaporated in the second chamber C2 may transfer the heat to the plurality of condensation ribs 45 while exchanging heat with the plurality of condensation ribs 45. The refrigerant may be quickly condensed by the surface areas increased by the plurality of fine stepped portions 46, flow downward to the lower space of the second chamber C2, and then be collected.

That is, the condensing part 140 may be defined as a component configured to perform mutual heat exchange by using the principle of the sensible heat of outside air and the latent heat by which the gaseous refrigerant is condensed in the second chamber C2.

In addition, as illustrated in FIGS. 5 and 6, the condensing part 140 may further include a plurality of support bars 48 each having two opposite front and rear ends that support the front end of each of the plurality of condensation ribs 45 and the rear surface of the partition plate part 10. The plurality of support bars 48 serves to support, at a plurality of points, the front ends of the plurality of condensation ribs 45 spaced apart from one another in the forward/rearward direction to define the second chamber C2. Therefore, the plurality of support bars 48 serves to prevent shape deformation caused by an external force.

Meanwhile, the rim portion 11 of the partition plate part 10, among the components of the heat transfer part 110, may be coupled to be in surface contact with the rim portion of the heat dissipation plate part 40 among the components of the condensing part 140. A shield sealer 70 may be interposed between the partition plate part 10 and the rim portion of the heat dissipation plate part 40 and shield and seal the second chamber C2 and the external space.

The shield sealer 70 may be made of a rubber material. When the partition plate part 10 of the heat transfer part 110 and the heat dissipation plate part 40 of the condensing part 140 are coupled by a coupling force generated by a plurality of assembling screws, the shield sealer 70 may be coupled between and in close contact with the rear surface of the partition plate part 10 and the front surface of the heat dissipation plate part 40, thereby completely sealing the portion between the second chamber C2 and the external space. Therefore, it is possible to prevent the refrigerant stored in the second chamber C2 from leaking to the outside.

Figure 9A:
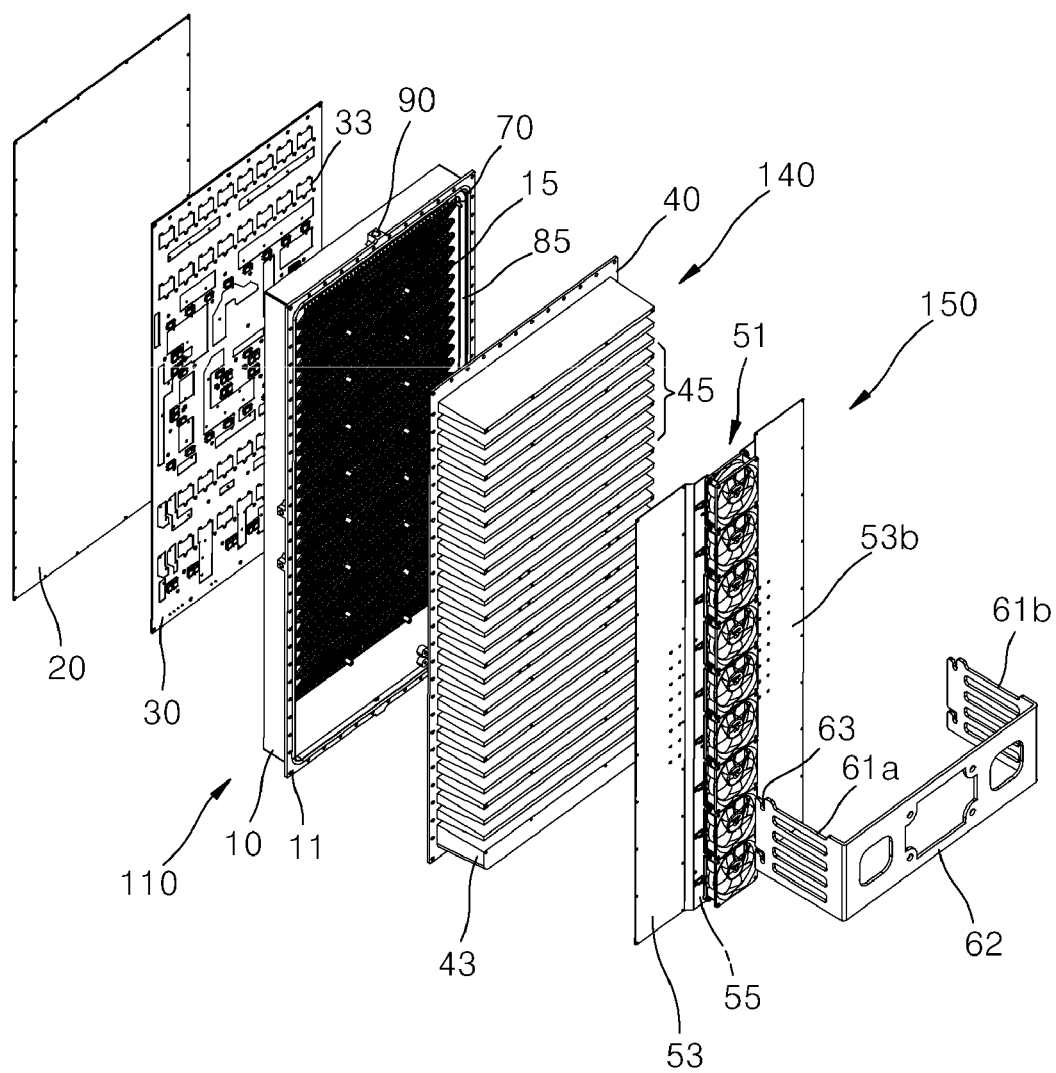
FIGS. 9A and 9B are exploded perspective views illustrating the heat transfer part and a condensing part.
Figure 9B:
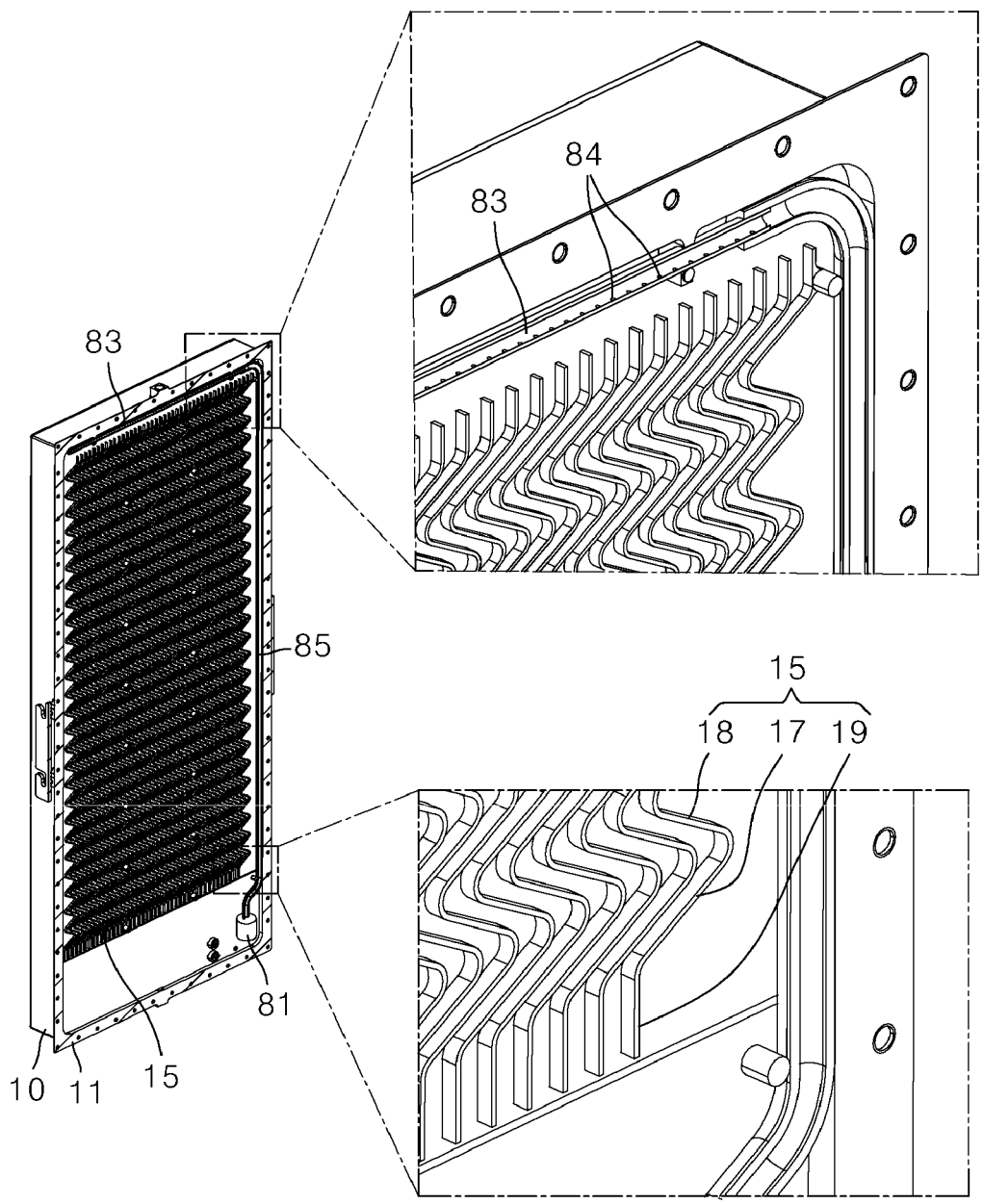
Figure 10A:
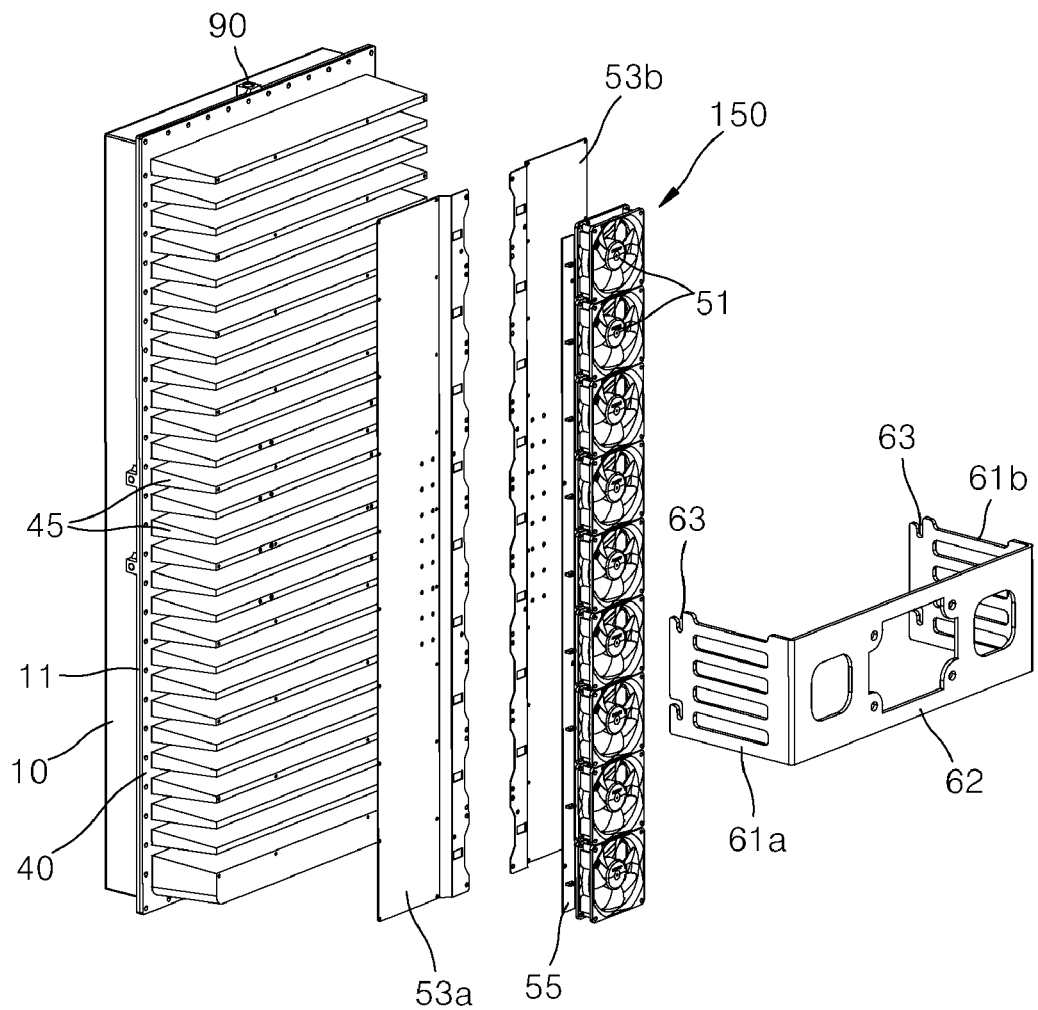
FIGS. 10A and 10B are exploded perspective views illustrating a blower part among the components of each of the heat dissipation devices for an electronic element according to the embodiment and another embodiment of the present invention.
Figure 10B:
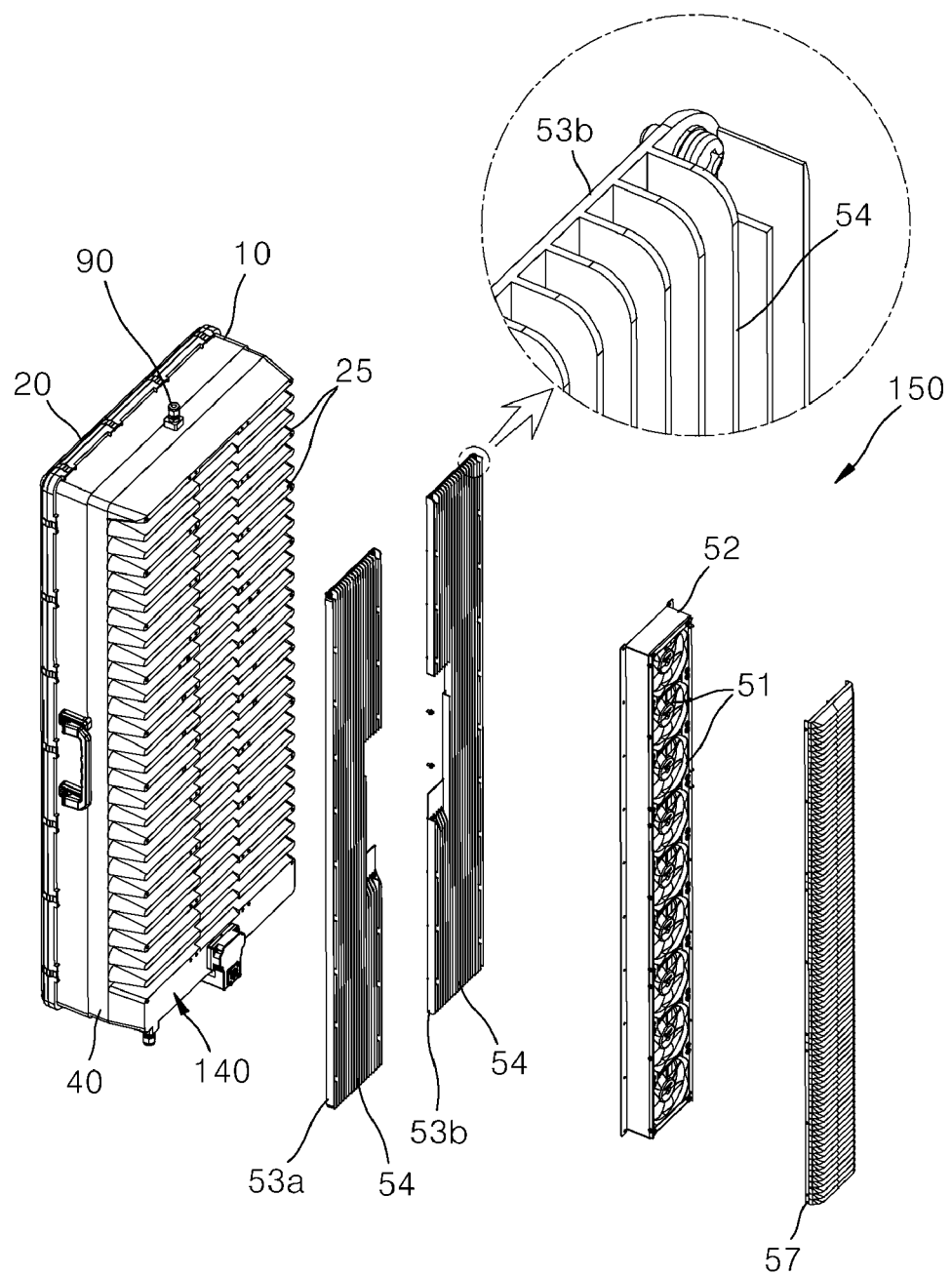
Figure 11:
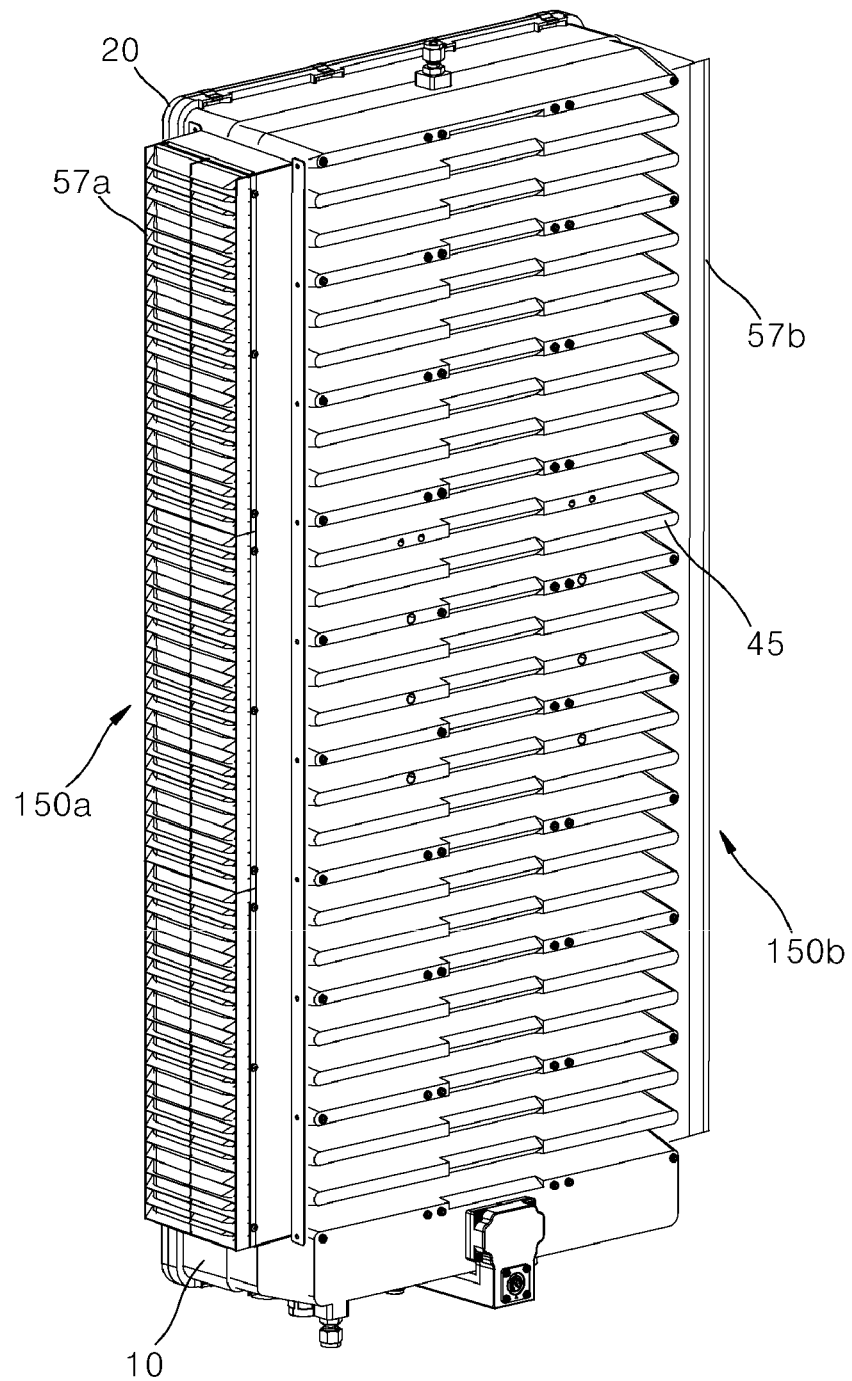
FIG. 11 is a rear perspective view illustrating a modified example of the blower part among the components of the heat dissipation device for an electronic element according to another embodiment of the present invention.
Figure 12:
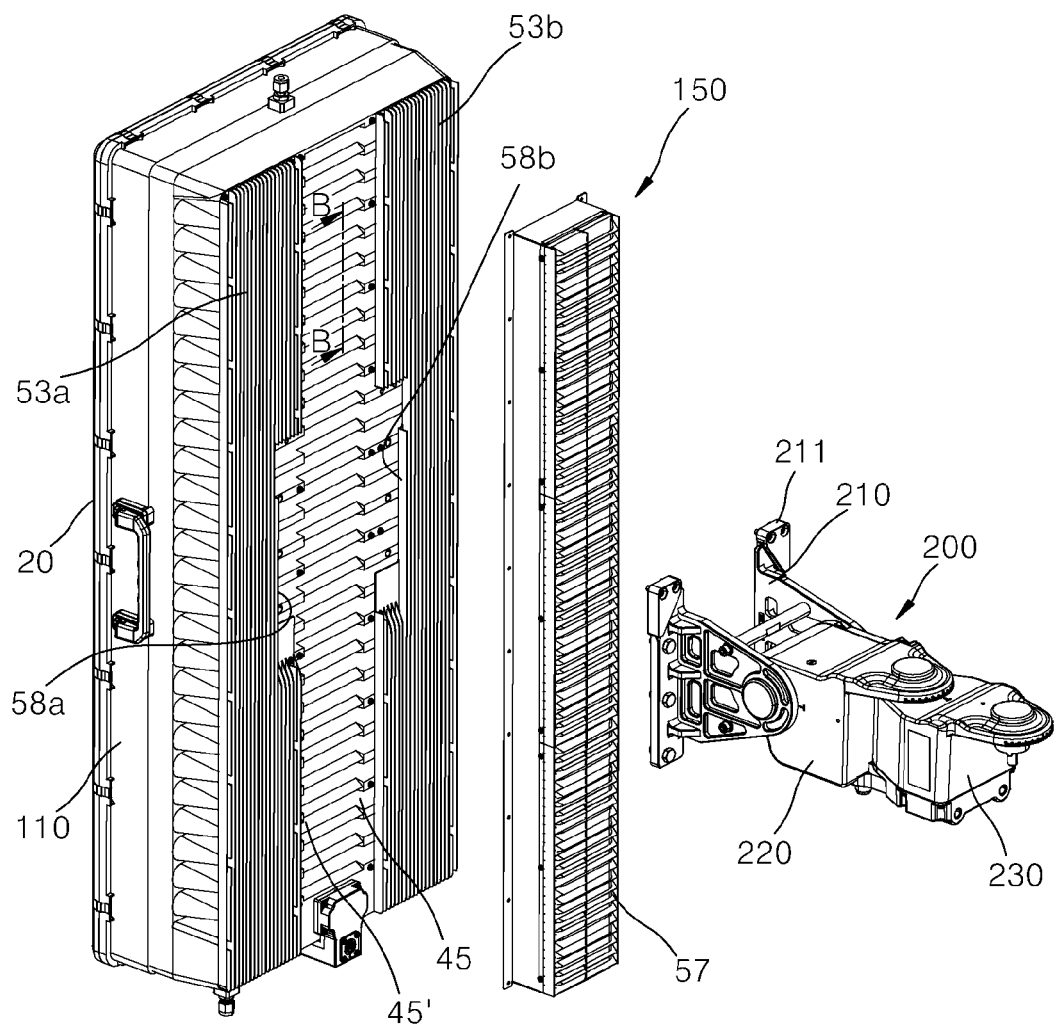
FIG. 12 is an exploded perspective view of FIG. 2B.
Figure 13:
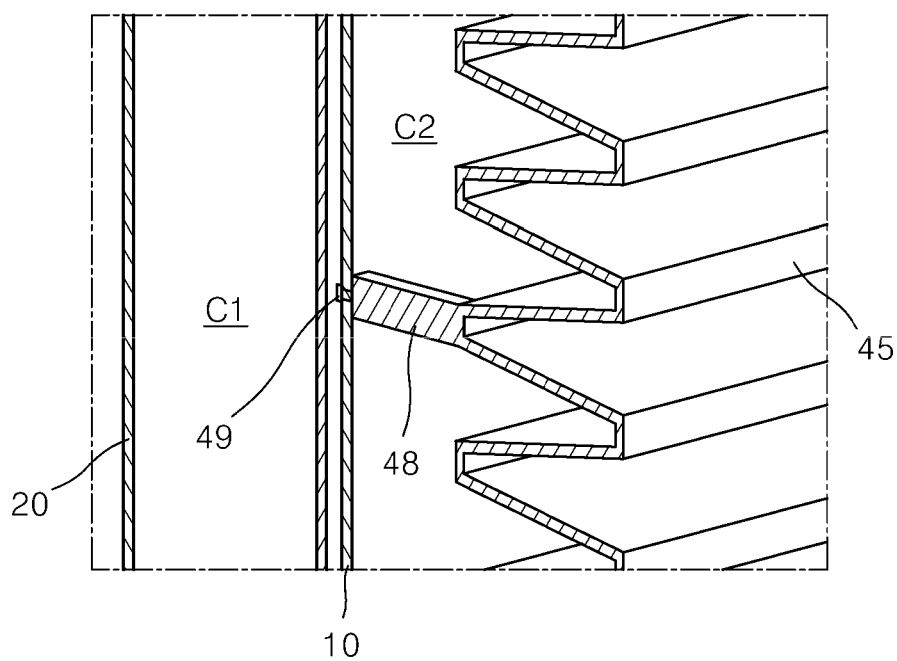
FIG. 13 is a partially cut-away perspective view taken along line B-B in FIG. 12.

FIGS. 9A and 9B are exploded perspective views illustrating the heat transfer part and the condensing part, FIGS. 10A and 10B are exploded perspective views illustrating the blower part among the components of each of the heat dissipation devices for an electronic element according to the embodiment and another embodiment of the present invention, FIG. 11 is a rear perspective view illustrating a modified example of the blower part among the components of the heat dissipation device for an electronic element according to another embodiment of the present invention, FIG. 12 is an exploded perspective view of FIG. 2B, and FIG. 13 is a partially cut-away perspective view taken along line B-B in FIG. 12.

As illustrated in FIGS. 9A and 9B, the refrigerant supply part 81 may be provided at the lower side of the space of the second chamber C2, and the injection part 83 may be provided at the upper side of the space of the second chamber C2.

In this case, the refrigerant supply part 81 may be configured as the refrigerant supply pump positioned at the lower side of the second chamber C2. The injection part 83 may be configured as the refrigerant injection nozzle positioned at the upper side of the second chamber C2 and configured to inject the liquid refrigerant, in the form of a spray, pumped by the refrigerant supply part 81.

Further, the refrigerant supply pump and the refrigerant injection nozzle may be connected to each other by the refrigerant flow pipe 85.

More specifically, as illustrated in FIGS. 6 and 9B, the refrigerant flow pipe 85 may be vertically fixed, in the upward/downward direction, to any one of the left and right ends of the partition plate part 10. A lower end of the refrigerant flow pipe 85 may be connected to the refrigerant supply pump, and an upper end of the refrigerant flow pipe 85 may be connected to the refrigerant injection nozzle.

Meanwhile, the refrigerant injection nozzle may be connected to and communicate with the upper end of the refrigerant flow pipe 85 and horizontally fixed to the upper end of the partition plate part 10 in the leftward/rightward direction. The refrigerant injection nozzle may have a plurality of injection nozzle holes 84 through which the refrigerant is discharged downward, and the plurality of injection nozzle holes 84 may be spaced apart from one another in the leftward/rightward direction.

Therefore, when the refrigerant supply part 81 configured as the refrigerant supply pump pumps the liquid refrigerant collected in the lower space of the second chamber C2, the liquid refrigerant may be supplied to the upper space of the second chamber C2 along the refrigerant flow pipe 85, the refrigerant may be injected downward in the form of a spray in the upper space of the second chamber C2 by the injection part 83 configured as the refrigerant injection nozzle, the refrigerant may be evaporated into the gaseous refrigerant while being adsorbed to the plurality of evaporation-inducing ribs 15 formed on the rear surface of the partition plate part 10 among the components of the heat transfer part 110, the refrigerant may be condensed into the liquid refrigerant by the plurality of condensation ribs 45 of the condensing part 140, and then the refrigerant may be collected in the lower space of the second chamber C2. The above-mentioned process may be repeated to more quickly dissipate the heat from the first chamber C1.

In this case, the refrigerant supply pump, which is the refrigerant supply part 81, may be fixedly installed on a liquid refrigerant storage rib 43 larger than the plurality of condensation ribs 45 in the lower space of the second chamber C2. The liquid refrigerant, which is condensed and liquefied by the plurality of condensation ribs 45, may be typically stored in the liquid refrigerant storage rib 43, such that an inlet of a refrigerant suction pipe (not illustrated) of the refrigerant supply pump may at least be immersed in the refrigerant.

Further, as illustrated in FIG. 6, the refrigerant supply pump may be electrically connected to the printed circuit board 30 in the first chamber C1 by means of a pair of connecting pins 87. More specifically, as illustrated in FIG. 6, the pair of connecting pins 87 may be disposed to penetrate the heat transfer part 110 (i.e., the partition plate part 10) between the first chamber C1 and the second chamber C2 and serve to electrically connect the printed circuit board 30 in the first chamber C1 and the refrigerant supply pump in the second chamber C2. Any one of the pair of connecting pins 87 may serve to correspond to a negative power terminal, and the other of the pair of connecting pins 87 may serve to correspond to a positive power terminal, such that a process of supplying power for operating the refrigerant supply pump and a process of cutting off the supply of power may be controlled.

Referring to FIGS. 9A, 9B, and 10A, the blower part 150 may include: a plurality of air blowers 51 arranged in multiple stages in the upward/downward direction at the rear side of the condensing part 140; and a pair of guide bracket panels 53a and 53b configured to mediate the coupling of the plurality of air blowers 51 to the plurality of condensation ribs 45 and laterally guide the air blown by the plurality of air blowers 51.

That is, the plurality of air blowers 51 may serve to blow the outside air from the rear side and blow the air between the plurality of condensation ribs 45. Therefore, the outside air blown by the plurality of air blowers 51 may be blown to the outside of the plurality of condensation ribs 45, which makes it possible to reduce the time for which the gaseous refrigerant existing in the second chamber C2 is condensed.

In this case, as illustrated in FIG. 10A, the pair of guide bracket panels 53a and 53b may block left and right portions, respectively, based on the plurality of air blowers 51 disposed on a middle portion of the rear side of the plurality of condensation ribs 45 among the components of the condensing part 140, thereby allow the outside air introduced by the plurality of air blowers 51 to flow laterally between the plurality of condensation ribs 45.

Meanwhile, as illustrated in FIG. 10B, the pair of guide bracket panels 53a and 53b, among the components of the blower part 150, may serve to guide the blowing direction of the plurality of air blowers 51. Further, a plurality of heat dissipation fins 54 may protrude from rear surfaces of the pair of guide bracket panels 53a and 53b and absorb and dissipate the heat transferred through tips of the plurality of condensation ribs 45.

In addition, as illustrated in FIG. 10A, the heat dissipation device for an electronic element according to the embodiment of the present invention adopts the configuration in which the plurality of air blowers 51 is assembled directly to the pair of guide brackets 53a and 53b. However, as illustrated in FIG. 10B, the heat dissipation device may adopt a configuration in which the plurality of air blowers 51 is primarily fixed to an air blower bracket 52 to mediate the coupling of the pair of guide brackets 53a and 53b and then integrally assembled to the pair of guide brackets 53a and 53b. In this case, as illustrated in FIG. 10B, the blower part 150 may further include a bracket cover panel 57 configured to cover the front surface of the air blower bracket 52. The bracket cover panel 57 may be provided in the form of a grille through which outside air may be introduced from the rear side by the air blowers 51.

Further, as illustrated in FIGS. 9A to 10A, the blower part 150 may further include a printed circuit board 55 for an air blower, and the printed circuit board 55 may be provided on any one 53a of the pair of guide bracket panels 53a and 53b and control operations of the plurality of air blowers 51. Although not illustrated in the drawings, the printed circuit board 55 for an air blower may be provided to transmit power to or receive power from the printed circuit board 30 positioned in the first chamber C1. Alternatively, the printed circuit board 55 may control the supply of power for operating the plurality of air blowers 51 by receiving power independently of the printed circuit board 30 in the first chamber C1.

Meanwhile, as illustrated in FIG. 11, a pair of blower parts 150a and 150b may be respectively provided at two opposite left and right ends of the condensing part 140. In this case, the blower parts 150a and 150b may be set to implement different blowing directions in accordance with the heights of the plurality of condensation ribs 45. For example, as illustrated in FIG. 11, the air blower 51 provided at an uppermost end of the condensing part 140 may be installed to blow air so that the air passes through at least three condensation ribs 45 and is blown in any one of the horizontal leftward and rightward directions. The air blower 51, which is positioned below the air blower 51 provided at the uppermost end of the condensing part 140, may be installed to blow air so that the air passes through at least three condensation ribs 45 and is blown in the other of the horizontal leftward and rightward directions. That is, the blowing directions of the air blowers may be repeatedly opposite to one another.

In this case, in the case in which the single blower part 150 is elongated and provided in the upward/downward direction at a center of the rear surface of the condensing part 140 as illustrated in FIG. 12, the rear end of each of the plurality of condensation ribs 45 may be provided in the form of a pointed rib 45' to minimize blowing resistance caused by the air blower 51. The pointed rib 45' may be formed to have a triangular cross-section that converges toward the rear side thereof. As a result, it is possible to minimize blowing resistance when the air is blown between the plurality of condensation ribs 45 by the air blower 51.

Meanwhile, as illustrated in FIGS. 7 and 10A, the heat dissipation device 1 for an electronic element according to the embodiment of the present invention may further include a mounting bracket 60 configured to surround the rear side of the heat dissipation plate part 40 and mediate the coupling to a predetermined part and having left and right ends fixed to the partition plate part 10 of the heat transfer part 110.

For example, as illustrated in FIGS. 7 and 10A, the mounting bracket 60 serves to mediate the coupling of an antenna device (no reference numeral), which has the printed circuit board 30 on which the antenna elements are mounted, to a predetermined part such as a strut pole (not illustrated) provided at an installation location.

Left and right ends 61a and 61b of the mounting bracket 60 extend forward by a predetermined length toward the left and right sides of the heat dissipation plate part 40, respectively, from the rear side of the blower part 150. The mounting bracket 60 may be completely fixed by seating non-illustrated fixing screws, which are temporarily assembled to screw coupling parts 13 (see FIG. 4A) provided at the left and right ends of the partition plate part 10, in screw seating grooves 63 opened from below to above and then securely fastening the fixing screws.

The left and right ends 61a and 61b of the mounting bracket 60 may be connected by a bracket main body panel 62, and the bracket main body panel 62 may be fixed to the predetermined part such as the strut pole, thereby fixing the heat dissipation device 1 for an electronic element according to the present embodiment.

However, the mounting bracket 60 need not be necessarily provided to install the heat dissipation device 1 for an electronic element on the strut pole. According to another embodiment of the present invention, as illustrated in FIGS. 10B and 11 to 13, in a case in which the heat dissipation device is installed on the strut pole by means of the clamping device 200, coupling flanges 211 provided at tips of the tilting part 210, among the components of the clamping device 200, may be coupled directly to the rear ends of the plurality of condensation ribs 45.

In this case, the tilting part 210 may be coupled to surround the blower part 150 from the rear side. Avoidance cut-out portions 58a and 58b, which have predetermined cut-out portions, may be provided in the pair of guide bracket panels 53a and 53b so that the coupling flanges 211 provided at the tips of the tilting part 210 are coupled directly to the rear ends of the plurality of condensation ribs 45 by bolting or screwing without interference.

Meanwhile, as illustrated in FIG. 13, the plurality of support bars 48 may be integrally provided at the front ends of the plurality of condensation ribs 45, among the components of the condensing part 140, and the front ends of the plurality of support bars 48 may be screw-coupled to the rear surface of the partition plate part 10 by assembling screws 49. However, the plurality of support bars 48 need not be necessarily integrated with the plurality of condensation ribs 45. Although not illustrated in the drawings, the support bar may be provided in a separate bar shape, and two opposite front and rear ends of the support bar may be screw-coupled by the assembling screws 49.

The embodiments of the heat dissipation device for an electronic element according to the present invention have been described above in detail with reference to the accompanying drawings. However, the present invention is not necessarily limited by the embodiments, and various modifications of the embodiment and any other embodiments equivalent thereto may of course be carried out by those skilled in the art to which the present invention pertains.

Accordingly, the true protection scope of the present invention should be determined by the appended claims.

INDUSTRIAL APPLICABILITY

The present invention provides a heat dissipation device for an electronic element, which is capable of preventing an increase in size, improving heat dissipation performance, and quickly dissipating heat generated from the heating element by injecting the refrigerant to one side of the space in which the heating element is disposed and quickly evaporating the injected refrigerant.

The invention claimed is:

1. A heat dissipation device for an electronic element, the heat dissipation device comprising:
   a first chamber in which a printed circuit board having heating elements mounted thereon is disposed;
   a second chamber configured to conduct heat exchange with heat transferred from the first chamber and configured such that an injection part configured to inject a refrigerant and a refrigerant supply part configured to supply the refrigerant to the injection part are disposed in the second chamber;
   a heat transfer part disposed between the first chamber and the second chamber and configured to receive heat from the heating elements of the first chamber and supply the heat to the second chamber; and
   a condensing part configured to condense the refrigerant injected into the second chamber,
   wherein a plurality of evaporation-inducing ribs is provided on a surface of the heat transfer part exposed to the second chamber and allows the refrigerant injected by the injection part to be adsorbed and then flow downward in a zigzag direction,
   wherein the plurality of evaporation-inducing ribs each comprises:
   a refrigerant inflow portion disposed adjacent to the injection part and provided vertically in an upward/downward direction;
   one side inclined portion inclined, bent, and extending downward toward one side from a lower end of the refrigerant inflow portion; and
   other side inclined portion inclined, bent, and extending downward toward the other side from a lower end of the one side inclined portion, and
   wherein the one side inclined portion and the other side inclined portion are repeatedly formed.

2. The heat dissipation device of claim 1, wherein the plurality of evaporation-inducing ribs protrudes in a direction from the first chamber to a portion where the second chamber is provided, the plurality of evaporation-inducing ribs being configured to adsorb the refrigerant injected from the injection part, and
   wherein the plurality of evaporation-inducing ribs defines zigzag flow paths to increase a heat exchange area in which heat exchange with heat of the heating elements transferred from the first chamber is performed and to increase the adsorption time.

3. The heat dissipation device of claim 1, wherein the heat transfer part comprises:
   a partition plate part disposed to separate the first chamber and the second chamber; and
   a plurality of contact protrusions configured to be in contact with the printed circuit board and protruding from one surface of two opposite surfaces of the partition plate part that is exposed to the first chamber, and wherein the plurality of evaporation-inducing ribs integrally protrudes from one surface of the two opposite surfaces of the partition plate part that is exposed to the second chamber.

4. The heat dissipation device of claim 3, wherein the second chamber is a space recessed forward from an end of a rim portion of the partition plate part and comprises a heat dissipation plate part configured to constitute the condensing part and coupled to cover a rear side of the partition plate part.

5. The heat dissipation device of claim 3, wherein shapes of the plurality of contact protrusions are designed in consideration of the amount of heat generation based on mounting positions of the heating elements mounted on the printed circuit board.

6. The heat dissipation device of claim 1, wherein the heat transfer part is configured such that the amount of generated heat transferred from the first chamber to the second chamber exchanges heat with total heat of the refrigerant, and
wherein the refrigerant stored in the second chamber changes in phase while being evaporated and condensed by a change in enthalpy of sensible heat and latent heat, such that heat is transferred from the first chamber to the second chamber.

7. The heat dissipation device of claim 1, wherein the refrigerant supply part is configured as a refrigerant supply pump positioned at a lower side of the second chamber,
wherein the injection part is configured as a refrigerant injection nozzle positioned at an upper side of the second chamber and injects the refrigerant pumped by the refrigerant supply part, and
wherein the refrigerant supply pump and the refrigerant injection nozzle are connected by a refrigerant flow pipe.

8. The heat dissipation device of claim 7, wherein the refrigerant flow pipe is fixed vertically in an upward/downward direction at a left or right end of a partition plate part,
wherein the refrigerant injection nozzle is connected to and communicates with an upper end of the refrigerant flow pipe and fixed to an upper end of the partition plate part horizontally in a leftward/rightward direction,
wherein the refrigerant injection nozzle has a plurality of injection nozzle holes through which the refrigerant is discharged downward, and
wherein the plurality of injection nozzle holes is spaced apart from one another in the leftward/rightward direction.

9. The heat dissipation device of claim 7, further comprising:
a pair of connecting pins configured to penetrate the heat transfer part between the first chamber and the second chamber and configured to electrically connect the printed circuit board in the first chamber and the refrigerant supply pump in the second chamber.

10. The heat dissipation device of claim 1, further comprising:
a pressure regulator configured to adjust a pressure in the second chamber.

11. The heat dissipation device of claim 1, wherein the heating element comprises at least one of an antenna element and a radio unit (RU).

12. A heat dissipation device for an electronic element, the heat dissipation device comprising:
a first chamber in which a printed circuit board having heating elements mounted thereon is disposed;
a second chamber configured to conduct heat exchange with heat transferred from the first chamber and configured such that an injection part configured to inject a refrigerant and a refrigerant supply part configured to supply the refrigerant to the injection part are disposed in the second chamber;
a heat transfer part disposed between the first chamber and the second chamber and configured to receive heat from the heating elements of the first chamber and supply the heat to the second chamber; and
a condensing part configured to condense the refrigerant injected into the second chamber,
wherein a plurality of evaporation-inducing ribs is provided on a surface of the heat transfer part exposed to the second chamber and allows the refrigerant injected by the injection part to be adsorbed and then flow downward in a zigzag direction,
wherein the condensing part comprises:
a heat dissipation plate part configured to define a part of a space of the second chamber while defining an external shape of a rear side of the second chamber; and
a plurality of condensation ribs protruding toward a rear side of the heat dissipation plate part and recessed in the space of the second chamber so that a part of the space of the second chamber is expanded, the plurality of condensation ribs being formed in multiple stages in an upward/downward direction of the heat dissipation plate part, and
wherein the plurality of condensation ribs each has a vertical cross-sectional area that gradually decreases toward the rear side of the heat dissipation plate part.

13. The heat dissipation device of claim 12, wherein the second chamber is a space recessed rearward from an end of a rim portion of the heat dissipation plate part and comprises a partition plate part configured to constitute the heat transfer part and coupled to cover a front side of the heat dissipation plate part.

14. The heat dissipation device of claim 12, wherein the plurality of condensation ribs each has an inner upper surface inclined downward and rearward, and an inner lower surface inclined upward and rearward.

15. The heat dissipation device of claim 12, wherein an upward inclination angle of the inner lower surface with respect to any horizontal surface is equal to or larger than a downward inclination angle of the inner upper surface with respect to the horizontal surface.

16. The heat dissipation device of claim 12, wherein inner surfaces of the plurality of condensation ribs have a plurality of fine stepped portions.

17. The heat dissipation device of claim 12, wherein the condensing part further comprises a plurality of support bars configured to support front ends of the plurality of condensation ribs and a rear surface of a partition plate part disposed to separate the first chamber and the second chamber.

18. The heat dissipation device of claim 12, further comprising:
a blower part provided at a rear side of the condensing part and configured to blow outside air toward the condensing part.

19. The heat dissipation device of claim 18, wherein the blower part comprises:
a plurality of air blowers arranged in multiple stages in an upward/downward direction at the rear side of the condensing part; and
a pair of guide bracket panels configured to mediate coupling of the plurality of air blowers to the plurality of condensation ribs and laterally guide the air blown by the plurality of air blowers.

20. The heat dissipation device of claim 19, wherein the blower part further comprises a printed circuit board configured to control blowing and provided on any one of the pair of guide bracket panels to control operations of the plurality of air blowers.

21. The heat dissipation device of claim 12, further comprising:
a pair of blower parts respectively provided at two opposite left and right ends of the condensing part and configured to blow outside air in horizontal leftward and rightward directions.

22. A heat dissipation device for an electronic element, the heat dissipation device comprising:
a first chamber in which a printed circuit board having heating elements mounted thereon is disposed;
a second chamber configured to conduct heat exchange with heat transferred from the first chamber and configured such that an injection part configured to inject a refrigerant and a refrigerant supply part configured to supply the refrigerant to the injection part are disposed in the second chamber;
a heat transfer part disposed between the first chamber and the second chamber and configured to receive heat from the heating elements of the first chamber and supply the heat to the second chamber; and
a condensing part configured to condense the refrigerant injected into the second chamber,
wherein a plurality of evaporation-inducing ribs is provided on a surface of the heat transfer part exposed to the second chamber and allows the refrigerant injected by the injection part to be adsorbed and then flow downward in a zigzag direction,
wherein the heat dissipation device further comprises:
a radome configured to define an external shape of a front side of the first chamber,
wherein the first chamber is provided between the radome and a partition plate part that constitutes the heat transfer part, and
wherein the second chamber is provided between the partition plate part and a heat dissipation plate part of the condensing part that defines an external shape of a rear side of the second chamber.

23. The heat dissipation device of claim 22, further comprising:
a mounting bracket configured to surround a rear side of the heat dissipation plate part and mediate coupling to a predetermined part and having left and right ends fixed to the partition plate part of the heat transfer part.

24. The heat dissipation device of claim 22, further comprising:
a shield sealer interposed between the partition plate part and a rim portion of the heat dissipation plate part and configured to shield and seal the second chamber and an external space.

* * * * *